United States Patent
Albrecht et al.

(10) Patent No.: US 9,772,421 B2
(45) Date of Patent: Sep. 26, 2017

(54) BEAM DETECTOR WITH CONTROL CIRCUIT

(71) Applicant: Robert Bosch GmbH, Stuttgart (DE)

(72) Inventors: Andrej Albrecht, Leinfelden-Echterdingen (DE); Tobias Zibold, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 157 days.

(21) Appl. No.: 14/406,231

(22) PCT Filed: Apr. 15, 2013

(86) PCT No.: PCT/EP2013/057793
§ 371 (c)(1),
(2) Date: Dec. 8, 2014

(87) PCT Pub. No.: WO2013/185948
PCT Pub. Date: Dec. 19, 2013

(65) Prior Publication Data
US 2015/0123646 A1   May 7, 2015

(30) Foreign Application Priority Data

Jun. 14, 2012 (DE) .................. 10 2012 210 004

(51) Int. Cl.
*G01R 27/26* (2006.01)
*G01V 3/02* (2006.01)
(Continued)

(52) U.S. Cl.
CPC ............... *G01V 3/02* (2013.01); *G01R 17/00* (2013.01); *H03K 5/02* (2013.01); *H03K 17/00* (2013.01)

(58) Field of Classification Search
CPC .................................. G01R 17/00; G01V 3/02
See application file for complete search history.

(56) References Cited

U.S. PATENT DOCUMENTS 8,334,623 B2  12/2012  Reime
2007/0146019 A1  6/2007  Foote
(Continued)

FOREIGN PATENT DOCUMENTS

CN  1643342 A  7/2005
DE  41 41 264 C1  3/1993
(Continued)

OTHER PUBLICATIONS

International Search Report corresponding to PCT Application No. PCT/EP2013/057793, mailed Aug. 6, 2013 (German and English language document) (5 pages).
(Continued)

*Primary Examiner* — Jermele M Hollington
*Assistant Examiner* — Feba Pothen
(74) *Attorney, Agent, or Firm* — Maginot, Moore & Beck LLP

(57) ABSTRACT

A circuit having a first, second, and third capacitor. Capacitor plates of the capacitors are connected to a first circuit node. The circuit supplies a first time-dependent voltage to the first capacitor, a second time-dependent voltage to the second capacitor, and a third time-dependent voltage to the third capacitor. The first and second voltages are clocked in antiphase. The second and third voltages are clocked in phase. The circuit has an amplifier, a synchronous demodulator, and a comparator. Inputs of the amplifier are connected to the first circuit node and ground. The synchronous demodulator alternately applies an output signal of the amplifier to inputs of the comparator, synchronously with the clock frequency of the first voltage. The circuit generates a control value dependent on an output of the comparator. The circuit changes amplitudes of the first and third voltage and/or the second voltage dependent on the control value.

19 Claims, 12 Drawing Sheets

(51) Int. Cl.
    *H03K 17/00*     (2006.01)
    *G01R 17/00*     (2006.01)
    *H03K 5/02*     (2006.01)

(56) References Cited

U.S. PATENT DOCUMENTS

| | | | |
|---|---|---|---|
| 2009/0212849 A1 | 8/2009 | Reime | |
| 2009/0230926 A1* | 9/2009 | Yang | H02M 3/07 320/167 |
| 2012/0049850 A1* | 3/2012 | Reime | G01V 3/107 324/329 |

FOREIGN PATENT DOCUMENTS

| | | |
|---|---|---|
| DE | 299 15 014 U1 | 5/2000 |
| DE | 10 2009 057 933 B3 | 2/2011 |
| DE | 10 2010 028 718 A1 | 11/2011 |
| DE | 10 2010 028 723 A1 | 11/2011 |
| EP | 2 589 987 A1 | 5/2013 |
| RU | 2 020 745 C1 | 9/1994 |
| RU | 2 133 969 C1 | 7/1999 |

OTHER PUBLICATIONS

Baxter, Larry K., Capacitive Sensors, Designs and Applications, IEEE Press Series on Electronics Technology, 1997, pp. 57-58; 231-235, New York, NY.

* cited by examiner

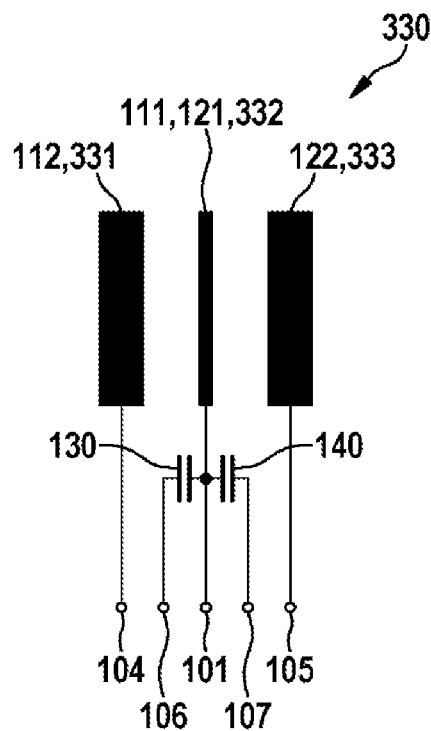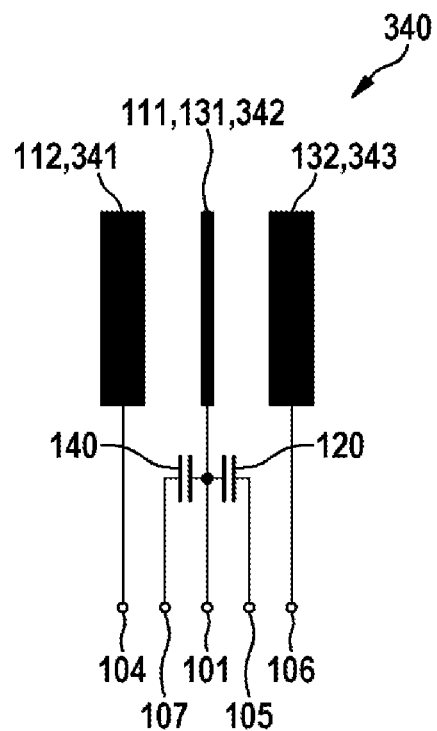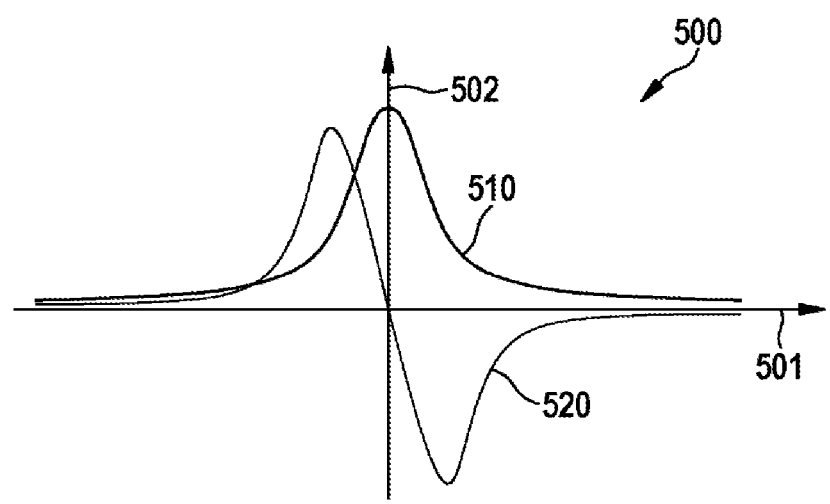

BEAM DETECTOR WITH CONTROL CIRCUIT

This application is a 35 U.S.C. §371 National Stage Application of PCT/EP2013/057793, filed on Apr. 15, 2013, which claims the benefit of priority to Serial No. DE 10 2012 210 004.0, filed on Jun. 14, 2012 in Germany, the disclosures of which are incorporated herein by reference in their entirety.

It is known to equip capacitive sensors with feedback-type bridge circuits as are described, for example, in "Capacitive sensors", Larry K. Baxter, IEEE Press. Capacitive beam detectors for sensing beams hidden in walls are also equipped with such feedback-type bridge circuits as is described, for example, in DE 10 2010 028 718.

It is known that capacitive beam detectors use one or more electrodes to which voltages are applied as a result of which electrical fields are built up. The fields can be associated with capacitances. Objects in the zone of influence of the beam detector change the electrical field and lead to changes in the capacitances.

However, the changes in capacitance are very small in comparison with the changing capacitance. This makes high demands on the capacitive measuring technology of the detectors.

SUMMARY

The object of the present disclosure consists in providing a circuit arrangement which enables a change in capacitance which is small in comparison with a total capacitance to be detected with improved resolution. It is also the object of the present disclosure to provide a beam detector having improved reliability with regard to over- and under-detection and increased depth of detection.

A circuit arrangement according to the disclosure comprises a first capacitor, a second capacitor and a third capacitor. In this context, first capacitor foils of the capacitors are in each case connected to a first circuit node. The capacitor foils can also be called capacitor plates or capacitor electrodes. These three terms are used synonymously within the context of the present application.

In this context, the circuit arrangement is designed to supply the first capacitor with a first time-dependent voltage, to supply the second capacitor with a second time-dependent voltage and to supply the third capacitor with a third time-dependent voltage. In this arrangement, the first voltage and the second voltage are clocked in antiphase whilst the second voltage and the third voltage are clocked in phase. The circuit arrangement also comprises an amplifier, a synchronous demodulator and a comparator. Inputs of the amplifier are connected to the first circuit node and to a ground contact. The synchronous demodulator is provided for applying an output signal of the amplifier synchronously with the clock of the first voltage alternately to two inputs of the comparator. The circuit arrangement is also designed to generate a control value in dependence on an output value of the comparator. In addition, the circuit arrangement is designed for changing amplitude amounts of the first voltage and of the third voltage and/or an amplitude amount of the second voltage in dependence on the control value. This circuit arrangement advantageously allows a detection of a change in capacitance, which is small in comparison with an absolute value of a capacitance of the first capacitor, the second capacitor and/or the third capacitor, of the first capacitor, of the second capacitor and/or of the third capacitor with high resolution.

In a development of the circuit arrangement, the latter has a fourth capacitor. In this arrangement, a first capacitor foil of the fourth capacitor is connected to the first circuit node. The circuit arrangement is then designed to supply the fourth capacitor with a fourth time-dependent voltage. This fourth voltage and the first voltage are clocked in phase. Advantageously, this results in a symmetric embodiment of the circuit arrangement which provides for a detection of small changes in capacitance of the capacitors with a very high signal/noise ratio.

In one embodiment of the circuit arrangement, the latter has a controllable direct-current source which is arranged between the ground contact and a second capacitor foil of the first capacitor or of the second capacitor or of the third capacitor or of the fourth capacitor. In this arrangement, the circuit arrangement has a resistor which is arranged between the second capacitor foil and a second circuit node which is provided for being at a constant potential increased compared with the ground contact. In this arrangement, a switch is arranged between the direct-current source and the second capacitor foil. The resistor then acts advantageously as a pull-up resistor across which a voltage is dropped, the magnitude of which depends on the value of the current intensity output by the controllable direct-current source. The capacitor is supplied with this voltage. The switch allows clocking of this voltage.

In a development of this circuit arrangement, the latter has a first controllable direct-current source, a second controllable direct-current source, a third controllable direct-current source, a fourth controllable direct-current source, a first switch, a second switch, a third switch, a fourth switch, a first resistor, a second resistor, a third resistor and a fourth resistor. In this context, the first switch is arranged between the second capacitor foil of the first capacitor and a first contact of the first direct-current source. A second contact of the first direct-current source is connected to the ground contact. The first resistor is arranged between the second capacitor foil of the first capacitor and the second circuit node. The second switch is arranged between the second capacitor foil of the second capacitor and a first contact of the second direct-current source. A second contact of the second direct-current source is connected to the ground contact. The second resistor is arranged between the second capacitor foil of the second capacitor and the second circuit node. The third switch is arranged between the second capacitor foil of the third capacitor and a first contact of the third direct-current source. A second contact of the third direct-current source is connected to the ground contact. The third resistor is arranged between the second capacitor foil of the third capacitor and the second circuit node. The fourth switch is arranged between the second capacitor foil of the fourth capacitor and a first contact of the fourth direct-current source. A second contact of the fourth direct-current source is connected to the ground contact. The fourth resistor is arranged between the second capacitor foil of the fourth capacitor and the second circuit node. The four direct-current sources, in connection with the four resistors acting as pull-up resistors, advantageously allow the generation of four time-dependent voltages which can be clocked by means of the four switches.

In a further development of the circuit arrangement, the latter has an inverting amplifier. In this arrangement, an inverting input of the inverting amplifier is connected to the second capacitor foil via a first resistor. A non-inverting input of the inverting amplifier is connected to a third circuit node which is provided for being at a constant potential which is located centrally between the potential of the second circuit node and the potential of the ground contact. An output of the inverting amplifier is connected to the inverting input of the inverting amplifier via a second resistor. In addition, the output of the inverting amplifier is connected to a further second capacitor foil of a further capacitor. Advantageously, two of the time-dependent voltages can be generated with only one direct-current source in this development of the circuit arrangement. Using the inverting amplifier then results in antiphase clocking of the two voltages.

In an alternative embodiment of the circuit arrangement, the latter has a controllable direct-voltage source which is arranged between the ground contact and a second capacitor foil of the first capacitor or of the second capacitor or of the third capacitor or of the fourth capacitor. In this arrangement, between one direct-voltage source and the second capacitor foil, a further switch is arranged which is designed for connecting the second capacitor foil either to the direct-voltage source or to the ground contact. Advantageously, one of the time-dependent voltages can be generated by means of the controllable direct-voltage source in this embodiment of the circuit arrangement. In this arrangement, the switch allows clocking of the voltage applied to the capacitor.

In a development of the circuit arrangement, the latter has a clock generator which is designed to generate a clock signal and a push-pull signal inverse to the clock signal. The circuit arrangement is then designed to drive the synchronous demodulator by means of the clock signal. In addition, the circuit arrangement is designed to clock the first voltage by means of the clock signal and to clock the second voltage by means of the push-pull signal. Advantageously, the first voltage and the second voltage then have antiphase clocking.

In a further alternative embodiment of the circuit arrangement, the latter has a controllable alternating-current source which is arranged between the ground contact and a second capacitor foil of the first capacitor or of the second capacitor or of the third capacitor or of the fourth capacitor. In this context, the circuit arrangement also has a resistor which is arranged between the second capacitor foil and a second circuit node which is provided for being at a constant potential increased compared with the ground contact. In this embodiment of the circuit arrangement, the resistor acts advantageously as a pull-up resistor across which a voltage is dropped which depends on the current intensity of the current output by the controllable alternating-current source. This voltage is applied to one of the capacitors. Advantageously, the time-dependence of the current output by the controllable alternating-current source also guarantees a time-dependence of the voltage dropped across the capacitor.

In a preferred embodiment of the circuit arrangement, the comparator is an integrating comparator or a sample-and-hold comparator. Advantageously, the comparator then allows a comparison of the signals output by the amplifier during both clock phases of the voltages clocked in antiphase.

A beam detector according to the disclosure has a circuit arrangement of the aforementioned type. Advantageously, the beam detector then allows a detection of objects with improved sensitivity. This lowers advantageously the risk of misdetections, that is to say of over- and under-detections. In addition, the maximum depth of detection of the beam detector rises advantageously.

In a preferred embodiment of the beam detector, the latter has a first electrode and a second electrode. In this arrangement, the first electrode forms the second capacitor foil of the first capacitor. The second electrode forms the first capacitor foil of the first capacitor. The capacitance of the first capacitor then changes advantageously when the beam detector is moved close to an object. This can be detected advantageously by the circuit arrangement with a high signal/noise ratio.

In a development of the beam detector, the latter has a third electrode. In this arrangement, the first electrode and the third electrode jointly form the second capacitor foil of the first capacitor. This advantageously results in a symmetric embodiment of the beam detector.

In an additional development of the beam detector, the circuit arrangement is designed with a fourth capacitor. The beam detector then has a fourth electrode and a fifth electrode. The fourth electrode and the fifth electrode jointly form the second capacitor foil of the second capacitor or of the third capacitor or of the fourth capacitor. The second electrode then forms the first capacitor foil of this capacitor. Advantageously, this beam detector, too, has a symmetric embodiment. In this arrangement, capacitances of two capacitors change advantageously in this beam detector when the beam detector is brought close to an object. Advantageously, this can be detected by the circuit arrangement with a high resolution.

In an alternative development of the beam detector, the latter has a third electrode. The third electrode and the second electrode then form the second capacitor, the third capacitor or the fourth capacitor. In this embodiment of the beam detector, too, two capacitances change advantageously when the beam detector is brought close to an object.

In a development of this beam detector, the circuit arrangement is designed with four capacitors. The beam detector then has a fourth electrode and a fifth electrode. The fourth electrode and the second electrode and the fifth electrode and the second electrode form the two capacitors not formed with the first electrode and with the third electrode.

Advantageously, the capacitances of all four capacitors change in this beam detector when the beam detector is brought close to an object.

In a preferred embodiment of the beam detector, the second electrode is arranged between the first electrode and the third electrode. Advantageously, the beam detector then allows absolute or differential measurement of an approach of the beam detector to an object depending on how the electrodes are connected.

It is suitable that the capacitors of the circuit arrangement of the beam detector not formed by electrodes are designed as fixed-value capacitors. Advantageously, the capacitances of the capacitors designed as fixed-value capacitors then do not change when the beam detector approaches an object.

In a preferred embodiment of the beam detector, the electrodes are designed as metallic plates. For example, the electrodes can be designed as metallic surfaces on a circuit board. Advantageously, the capacitance of the electrodes then changes when the beam detector is brought close to an object.

BRIEF DESCRIPTION OF THE DRAWINGS

The disclosure will now be explained in greater detail by means of the attached figures in which:

FIGS. 8 and 9 show diagrammatic representations of beam detectors with two excited electrodes for differential measurements;

FIG. 10 shows a graph for comparing absolute and differential measurements;

DETAILED DESCRIPTION

Figure 1:
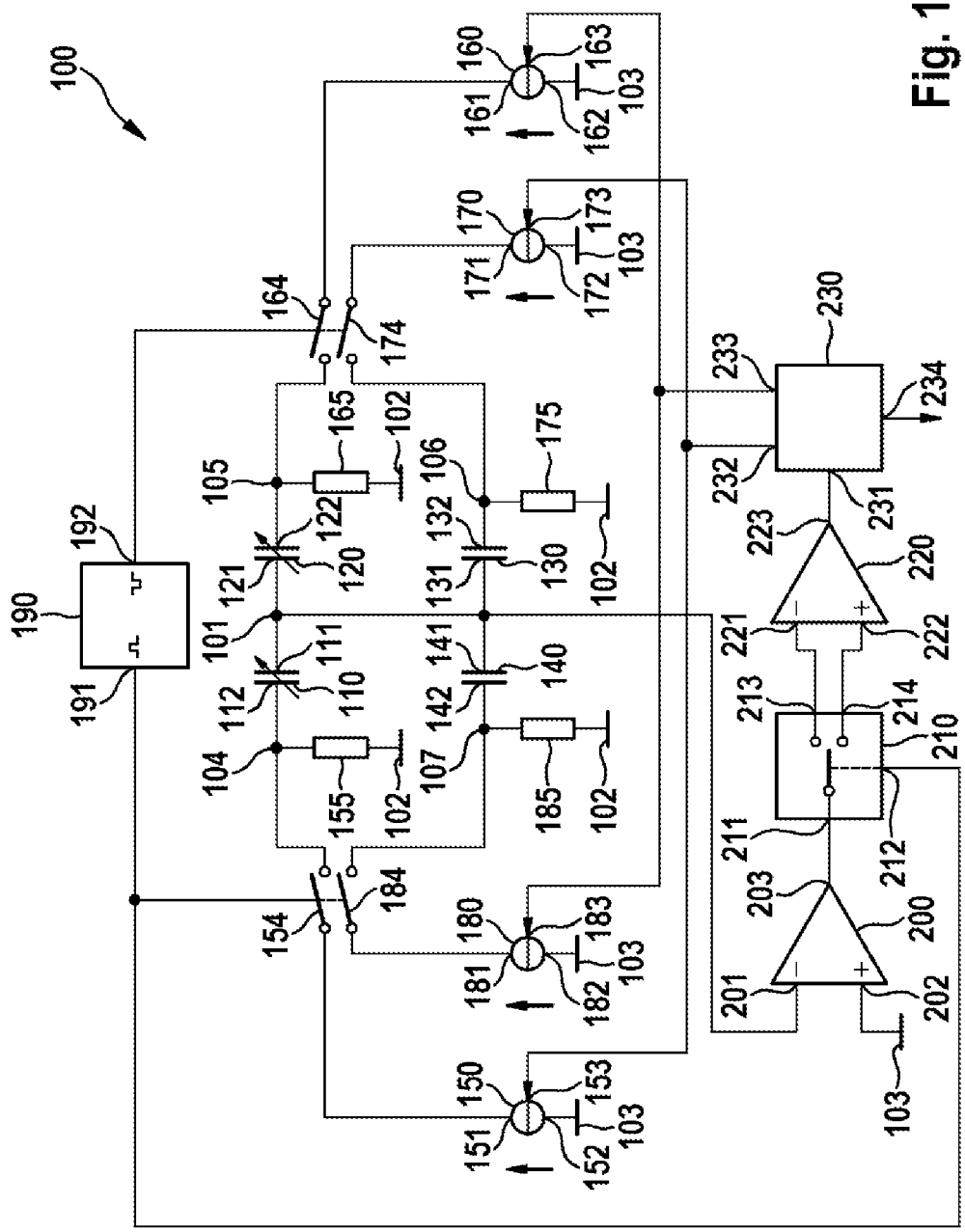
FIG. 1 shows a diagrammatic representation of a circuit arrangement.

FIG. 1 shows in a diagrammatic representation a circuit arrangement 100. The circuit arrangement 100 is used as control circuit for the detection of changes of capacitances of one or more capacitors. The circuit arrangement 100 can be used, for example, in capacitive detectors, especially in capacitive beam detectors.

The circuit arrangement 100 has a first circuit node 101, a second circuit node 102 and a ground contact 103. During operation of the circuit arrangement 100, the second circuit node 102 is at a potential increased with respect to the ground contact 103 so that a voltage Vcc is present between the second circuit node 102 and the ground contact 103. In addition, the circuit arrangement 100 comprises a fourth circuit node 104, a fifth circuit node 105, a sixth circuit node 106 and a seventh circuit node 107.

The circuit arrangement 100 has a first capacitor 110, a second capacitor 120, a third capacitor 130 and a fourth capacitor 140. The first capacitor 110 has a first capacitor foil 111 and a second capacitor foil 112. The capacitor foils 111, 112 can also be called capacitor plates or capacitor electrodes. The second capacitor 120 has a first capacitor foil 121 and a second capacitor foil 122. The third capacitor 130 has a first capacitor foil 131 and a second capacitor foil 132. The fourth capacitor 140 has a first capacitor foil 141 and a second capacitor foil 142. The first capacitor foils 111, 121, 131, 141 of the capacitors 110, 120, 130, 140 are connected to the first circuit node 101.

The circuit arrangement 100 also has a first direct-current source 150, a second direct-current source 160, a third direct-current source 170 and a fourth direct-current source 180. The four direct-current sources 150, 160, 170, 180 are controllable direct-current sources which are provided for outputting direct currents with a controllable amplitude. The first direct-current source 150 has a first contact 151, a second contact 152 and a control contact 153. The second direct-current source 160 has a first contact 161, a second contact 162 and a control contact 163. The third direct-current source 170 has a first contact 171, a second contact 172, and a control contact 173. The fourth direct-current source 180 has a first contact 181, a second contact 182 and a control contact 183. The second contacts 152, 162, 172, 182 of the direct-current sources 150, 160, 170, 180 are connected in each case to the ground contact 103. Via the control contacts 153, 163, 173, 183, the direct-current sources 150, 160, 170, 180 can be supplied in each case with a control value which specifies the magnitude of the current intensities output by the direct-current sources 150, 160, 170, 180 via their contacts 151, 152, 161, 162, 171, 172, 181, 182.

The circuit arrangement 100 comprises also a first switch 154, a first pull-up resistor 155, a second switch 164, a second pull-up resistor 165, a third switch 174, a third pull-up resistor 175, a fourth switch 184 and a fourth pull-up resistor 185. The second capacitor foil 112 of the first capacitor 110 is connected to the fourth circuit node 104. The first pull-up resistor 155 is arranged between the fourth circuit node 104 and the second circuit node 102. The first switch 154 is arranged between the fourth circuit node 104 and the first contact 151 of the first direct-current source 150. The second capacitor foil 122 of the second capacitor 120 is connected to the fifth circuit node 105. The second pull-up resistor 165 is arranged between the fifth circuit node 105 and the second circuit node 102. The second switch 164 is arranged between the fifth circuit node 105 and the first contact 161 of the second direct-current source 160. The second capacitor foil 132 of the third capacitor 130 is connected to the sixth circuit node 106. The third pull-up resistor 175 is arranged between the sixth circuit node 106 and the second circuit node 102. The third switch 164 is arranged between the sixth circuit node 106 and the first contact 171 of the third direct-current source 170. The second capacitor foil 142 of the fourth capacitor 140 is connected to the seventh circuit node 107. The fourth pull-up resistor 185 is arranged between the seventh circuit node 107 and the second circuit node 102. The fourth switch 184 is arranged between the seventh circuit node 107 and the first contact 181 of the fourth direct-current source 180.

The circuit arrangement 100 comprises also a clock generator 190 with a clock signal output 191 and a push-pull signal output 192. The clock generator 190 is designed for outputting a clock signal having a fixed frequency via the clock signal output 191. In addition, the clock generator 190 is designed for outputting via the push-pull signal output 192 a push-pull signal which is phase shifted by 180° with respect to the clock signal output via the clock signal output 191.

The circuit arrangement 100 is designed for switching the first switch 154 and the fourth switch 184 synchronously with the clock signal output via the clock signal output 191. In addition, the circuit arrangement 100 is designed for switching the second switch 164 and the third switch 174 synchronously with the push-pull signal output via the push-pull signal output 192.

The circuit arrangement 100 comprises also an amplifier 200, a synchronous demodulator 210, a comparator 220 and a default value generator 230. The amplifier has a negative input 201, a positive input 202 and an output 203. The negative input 201 of the amplifier 200 is connected to the first circuit node 101 of the circuit arrangement 100. The positive input 202 of the amplifier 200 is connected to the ground contact 103. The synchronous demodulator 210 has a signal input 211, a modulation input 212, a first output 213 and a second output 214. The signal input 211 of the synchronous demodulator 210 is connected to the output 203 of the amplifier 200. The modulation input 212 is connected to the clock signal output 191 of the clock generator 190. The comparator 220 has a first input 221, a second input 222 and an output 223. The first input 221 is connected to the first output 213 of the synchronous demodulator 210. The second input 222 of the comparator 220 is connected to the second output 214 of the synchronous demodulator 210. The default value generator 230 has a deviation input 231, a first control signal output 232, a second control signal output 233 and a default value output 234. The deviation input 231 is connected to the output 223 of the comparator 220. The first control signal output 232 is connected to the control contact 153 of the first direct-current source 150 and to the control contact 173 of the third direct-current source 170. The second control signal output 233 of the default value generator 230 is connected to the control contact 163 of the second direct-current source 160 and to the control contact 183 of the fourth direct-current source 180.

The first direct-current source 150 generates a current $I_A$. The second direct-current source 160 generates a current $I_B$. The third direct-current source 170 generates a current $I_{-A}$. The fourth direct-current source 180 generates a current $I_{-B}$. The currents $I_A$ and $I_{-B}$ of the first direct-current source 150 and of the fourth direct-current source 180 are interrupted by the first switch 154 and the fourth switch 184 at the rate of the clock signal output via the clock signal output 191 of the clock generator 190. The currents $I_B$ and $I_{-A}$ of the second direct-current source 160 and of the third direct-current source 170 are interrupted by means of the second switch 164 and of the third switch 174 at the rate of the push-pull signal output via the push-pull signal output 192 of the clock generator 190. Across the four pull-up resistors 155, 165, 175, 185, voltages proportional to the currents $I_A$, $I_B$, $I_{-A}$, $I_{-B}$ are dropped which are present across the four capacitors 110, 120, 130, 140 with reference to the common reference potential at the first circuit node 101. The first circuit node 101 forms a virtual ground.

The signal output at the output 203 of the amplifier 200 is applied by the synchronous demodulator 210 clock-synchronously with the clock signal output via the clock signal output 191 alternatingly to the two inputs 221, 222 of the comparator 220. The comparator 220 can be, for example, an integrating comparator or a sample-and-hold comparator. If the comparator 220 is designed as an integrating comparator, it compares the integral of the signal output via the output 203 of the amplifier 200 during the first half of a clock cycle with the integral of this signal during the second half of a clock cycle. If the comparator 220 is designed as a sample-and-hold comparator, it compares the signal output via the output 203 of the amplifier 200 at a time in the first half of the clock cycle with the signal at a corresponding time in the second half of the clock cycle. The comparator 220 outputs a comparator signal depending on this comparison via its output 223.

The control-value generator 230 generates a default value n in dependence on this comparator signal received via the deviation input 231. For this purpose, the default value generator 230 can have proportional, integral and differential components. The default value generator 230 can be designed, for example, to be digital.

The default value generator 230 also generates a first control signal $I_1$ which is output via the first control signal output 232, and a second control signal $I_2$ which is output via the second control signal output 233. The first control signal $I_1$ is the sum of an offset value $I_0$ and n times a range value $I_\Delta$: $I_1 = I_0 + nI_\Delta$. The second control signal $I_2$ is the difference of the offset value $I_o$ and n times the range value $I_\Delta$: $I_2 = I_0 - nI_\Delta$. The default value n thus changes the two control signals $I_1$, $I_2$ oppositely by the offset value $I_0$. The first control signal $I_1$ is supplied by the first control signal output 232 of the default value generator 230 as control signal to the first direct-current source 150 and the third direct-current source 170 and determines the amplitudes of the currents $I_A$ and $I_{-A}$ output by the direct-current sources 150, 170. The second control signal $I_2$ is supplied as default value to the second direct-current source 160 and the fourth direct-current source 180 via the second control signal output 233 of the default value generator 230 and determines the amplitudes of the currents $I_B$ and $I_{-B}$ output by the direct-current sources 160, 180.

Via the control, dependent on the default value n, of the amplitudes of the current intensities $I_A$, $I_{-A}$, $I_B$, $I_{-B}$ output by the direct-current sources 150, 160, 170, 180, a clock-synchronous component of the signal present at the negative input 201 of the amplifier 200 is adjusted to the reference value at the positive input 202 of the amplifier 200, that is to say to the potential of the ground contact 103. Depending on whether the comparator 220 is designed as integrating comparator or as sample-and-hold comparator, this applies to the entire clock cycle or only to the sampling times. By this means, the first circuit node 101 becomes a virtual ground.

Since the circuit arrangement 100 controls the difference between the signals present at the inputs 201, 202 of the amplifier 200 to be zero, the amplifier 200 can be designed with a very high gain factor. This results in a very good signal/noise ratio of the circuit arrangement 100.

The first capacitor 110 has a capacitance $C_{mess}$. The second capacitor 120 has a capacitance $C_{ref}$. The third capacitor 130 has a capacitance $C_{komp,mess}$. The fourth capacitor 140 has a capacitance $C_{komp,ref}$. The pull-up resistors 155, 165, 175, 185 have in each case a resistance value $R_P$. In the borderline case of $R_P \to 0$, the following applies:

$$n = \frac{I_0(\lfloor C_{mess} - C_{komp,mess} \rfloor - \lfloor C_{ref} - C_{komp,ref} \rfloor)}{I_\Delta ([C_{mess} - C_{komp,mess}] + [C_{ref} - C_{komp,ref}])}. \quad \text{(Equation 1)}$$

The default value n is well defined as long as the nominator in equation 1 is not equal to zero. However, the circuit arrangement 100 of FIG. 1 only regulates if $C_{mess}$ is greater than $C_{komp,mess}$ and $C_{ref}$ is greater than $C_{komp,ref}$. If the allocation of the outputs 213, 214 of the synchronous demodulator 210 to the inputs 221, 222 of the comparator 220 is exchanged, the circuit arrangement 100 regulates if $C_{mess}$ is less than $C_{komp,mess}$ and $C_{ref}$ is less than $C_{komp,ref}$. Inverting the input signals of the amplifier 200 also produces the same effect.

The capacitances $C_{mess}$ and $C_{ref}$ are variable and have in each case a fixed component $C_{mess,0}$, $C_{ref,0}$ and a variable component $\Delta_{mess}$ and $\Delta_{ref}$. The following thus applies:

$C_{mess} = C_{mess,0} + \Delta_{mess}$ $C_{ref} = C_{ref,0} + \Delta_{ref}$

Selecting $C_{komp,mess} = C_{mess,0} - \epsilon$ and $C_{komp,ref} = C_{ref,0} - \epsilon$ then results in $$n = \frac{I_0(\Delta_{mess} - \Delta_{ref})}{I_\Delta(2\varepsilon + \Delta_{mess} + \Delta_{ref})}. \quad \text{(Equation 1')}$$

The remaining coupling ε can be selected arbitrarily, especially also arbitrarily small. Thus, the change of the default value n for predetermined changes $\Delta_{mess}$, $\Delta_{ref}$ of the capacitances of the measuring capacitor 110 and of the reference capacitor 120 can be predetermined arbitrarily, especially also arbitrarily large. This means that even small changes in capacitance lead to a large default value n used as measurement value.

In the circuit arrangement 100, an effective basic capacitance can be reduced advantageously without influencing an absolute change in capacitance. The basic capacitance effective in the circuit arrangement 100 is obtained as a sum of the differences of the capacitances of the first capacitor 110 and of the fourth capacitor 140, on the one hand, and of the second capacitor 120 and of the third capacitor 130 on the other hand. By means of an adapted choice of capacitances of the compensation capacitors 130, 140, the effective basic capacitance can assume an arbitrarily small value. An absolute change in capacitance caused by the approach of an object to the circuit arrangement 100, for example, is still proportional to the absolute values of the capacitances of the capacitors 110, 120, as before. Since the capacitances of these capacitors 110, 120 can assume arbitrarily large values without influencing the effective basic capacitance, sufficiently large values for changes in capacitance produced by the influence of an object can be achieved without great expenditure.

Instead of the compensation capacitors 130, 140, the circuit arrangement 100 can also have arbitrary complex impedances which can be configured, for example, as LCR networks.

In a simplified embodiment of the circuit arrangement 100, only one of the control signals $I_1$, $I_2$ generated by the default value generator 230 depends on the default value n. Thus, $I_1=I_0+nI_A$; $I_2=I_0+\text{const}$ or $I_1=I_0+\text{const}$; $I_2=I_0-nI_A$ then applies.

In a beam detector with the circuit arrangement 110, the measuring capacitor 110 will be designed typically as one or more electrodes, for example as a metallic surface on a circuit board. Similarly, however, one or more of the remaining capacitors 120, 130, 140 can also be designed as such electrodes. This can be of advantage especially with regard to the stability of the default value n with changing ambient conditions (temperature, air humidity). This will be discussed in greater detail later.

The principle forming the basis of the circuit arrangement 100 can be generalized as follows. According to equation 1, the four capacitances $C_{mess}$, $C_{ref}$, $C_{komp,mess}$ and $C_{komp,ref}$ enter the expression for the default value n with the same weighting in each case.

This applies if, as described, the pull-up resistors 155, 165, 175, 185 all have the same value $R_p$ and the same offset value $I_0$ and the same range value $I_A$ are used in each case for driving the four direct-current sources 150, 160, 170, 180. If, however, different values are allowed for the pull-up resistors 155, 165, 175, 185 and for the offset values $I_0$ and the range values $I_A$, equation 1 must be expanded by weight factors before the capacitances. This provides $$n = \frac{I_0([\alpha_{mess}C_{mess} - \alpha_{komp,mess}C_{komp,mess}] - [\alpha_{ref}C_{ref} - \alpha_{komp,ref}C_{komp,ref}])}{I_A([\alpha'_{mess}C_{mess} - \alpha'_{komp,mess}C_{komp,mess}] + [\alpha'_{ref}C_{ref} - \alpha'_{komp,ref}C_{komp,ref}])}.$$ (Equation 2)

In general, $\alpha_x = \alpha'_x$ applies. The values of the cancelled prefactors and of the uncancelled prefactors differ only if both the offset values $I_0$ and the range values $I_A$ are varied independently of one another.

In the text which follows, further variants of the circuit arrangement 100 of FIG. 1 will be explained by means of FIGS. 2, 3 and 4. In this context, FIGS. 2 and 3 only show the parts of the circuit arrangements which differ from the circuit arrangement 100 of FIG. 1. In all FIGS. 2, 3 and 4, the same reference symbols are used for components which correspond to components of the circuit arrangement 100 of FIG. 1.

Figure 2:
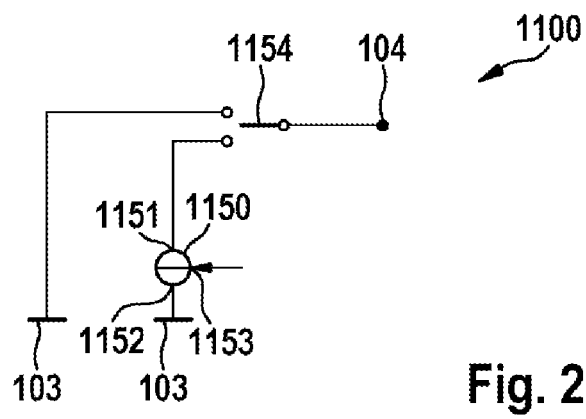
FIG. 2 shows a section of an alternative circuit arrangement.

FIG. 2 shows a section of a circuit arrangement 1100. In this circuit arrangement 1100, the first direct-current source 150, the first switch 154 and the first pull-up resistor 155 are omitted compared with the circuit arrangement 100 of FIG. 1. Instead, the circuit arrangement 1100 has a first direct-voltage source 1150 with a first contact 1151, a second contact 1152 and a control contact 1153. In addition, the circuit arrangement 1100 has a further switch 1154. The second contact 1152 of the first direct-voltage source 1150 is connected to the ground contact 103. The further switch 1154 of the circuit arrangement 1100 is used for connecting the fourth circuit node 104 either to the first contact 1154 of the first direct-voltage source 1150 or to the ground contact 103. The control contact 1153 of the first direct-voltage source 1150 is connected to the first control signal output 232 of the control-value generator 230. The further switch 1154 is switched synchronously with the clock signal output via the clock signal output 191 of the clock generator 190.

Thus, the first direct-current source 150 and the first pull-up resistor 155 are replaced by the first direct-voltage source 1150 in the circuit arrangement 1100 of FIG. 2 compared with the circuit arrangement 100 of FIG. 1. The first direct-voltage source 1150 generates directly a time-dependent direct voltage with adjustable amplitude which is applied via the first capacitor 110 with reference to the first circuit node 101. The remaining direct-voltage sources 160, 170, 180 and pull-up resistors 165, 175, 185 of the circuit arrangement 100 can be replaced correspondingly by direct-voltage sources in the circuit arrangement 1100 of FIG. 2. Equation 2 retains its validity in the circuit arrangement 1100 if different offset values $I_0$ and range values $I_A$ are admitted for the individual direct-voltage sources.

Figure 3:
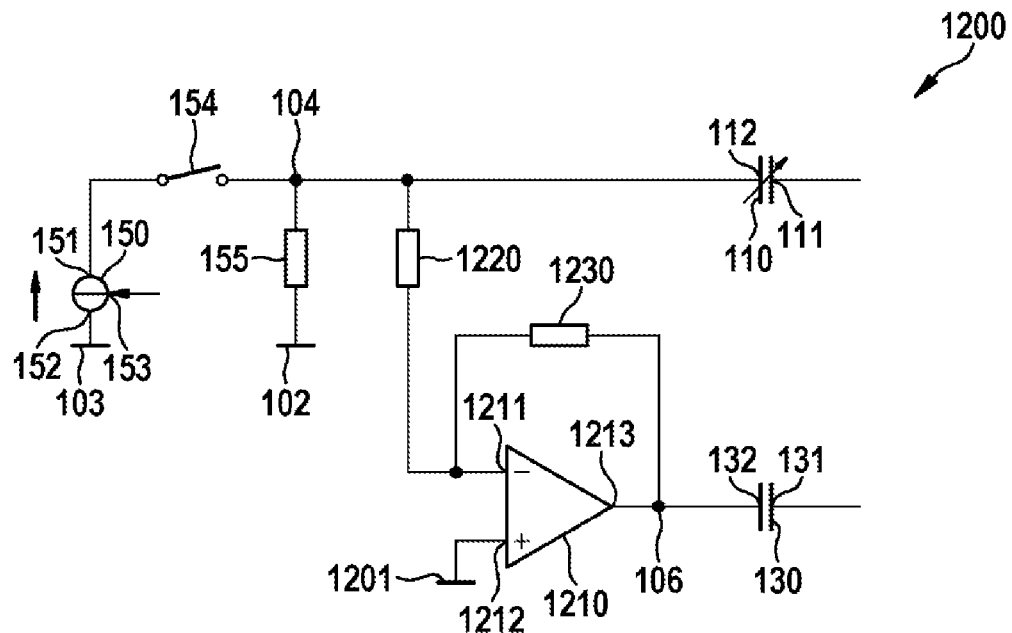
FIG. 3 shows a section of a further alternative circuit arrangement.

FIG. 3 shows a section of a further circuit arrangement 1200. In the circuit arrangement 1200, the third direct-voltage source 170, the third switch 174 and the third pull-up resistor 175 are omitted compared with the circuit arrangement 100 of FIG. 1. Instead, the circuit arrangement 1200 has an inverting amplifier 1210 with an inverting input 1211, a non-inverting input 1212 and an output 1213. The inverting input 1211 of the inverting amplifier 1210 is connected to the fourth circuit node 104 via a first resistor 1220. The output 1213 of the inverting amplifier 1210 is connected via the second resistor 1211. In addition, the output 1213 of the inverting amplifier 1210 is connected to the sixth circuit node 106. The non-inverting input 1212 of the inverting amplifier 1210 is connected to a third circuit node 1201. The third circuit node 1201 is at a constant electrical potential which lies in the center between the potential of the second circuit node 102 at the potential of the ground contact 103.

Between the third circuit node 1201 and the ground contact 103, a voltage Vcc/2 is thus present.

In the circuit arrangement 1200, the voltage applied to the third capacitor 130 is thus not generated by means of the third direct-current source 170 and the third pull-up resistor 175 but by means of the inverting amplifier 1210 from the current generated by the first direct-current source 150. Correspondingly, the voltage applied to the fourth capacitor 140 could also be generated by the current generated by the second direct-current source 160. Conversely, the voltage applied to the first capacitor 110 could also be generated from the current of the third direct-current source 170 and/or the voltage applied to the second capacitor 120 could be generated from the current of the fourth direct-current source 180, too.

If gain factors unequal to 1 are selected for the inverting amplifier 1210 and the further inverting amplifier of the circuit arrangement 1200, an expression according to equation 2 with weight factors before the values of the capacitances of the capacitors 110, 120, 130, 140 is also obtained for the default value n. The weight factors in this case result from the gain factors of the inverting amplifiers 1210.

The generalization shown by means of the circuit arrangement 1200 of FIG. 3 has the advantage that the flexibility in the choice of capacitance values of the capacitors 110, 120, 130, 140 is increased. If, for example, the capacitance values for the reference capacitor 120 or the compensation capacitors 130, 140 must be very small (because, for example, a capacitance of a measuring electrode is small), weight factors <1 can be selected for these capacitor capacitances. It is then possible to use capacitors having a larger capacitance which can be obtained in finer grading and with lesser tolerances.

Figure 4:
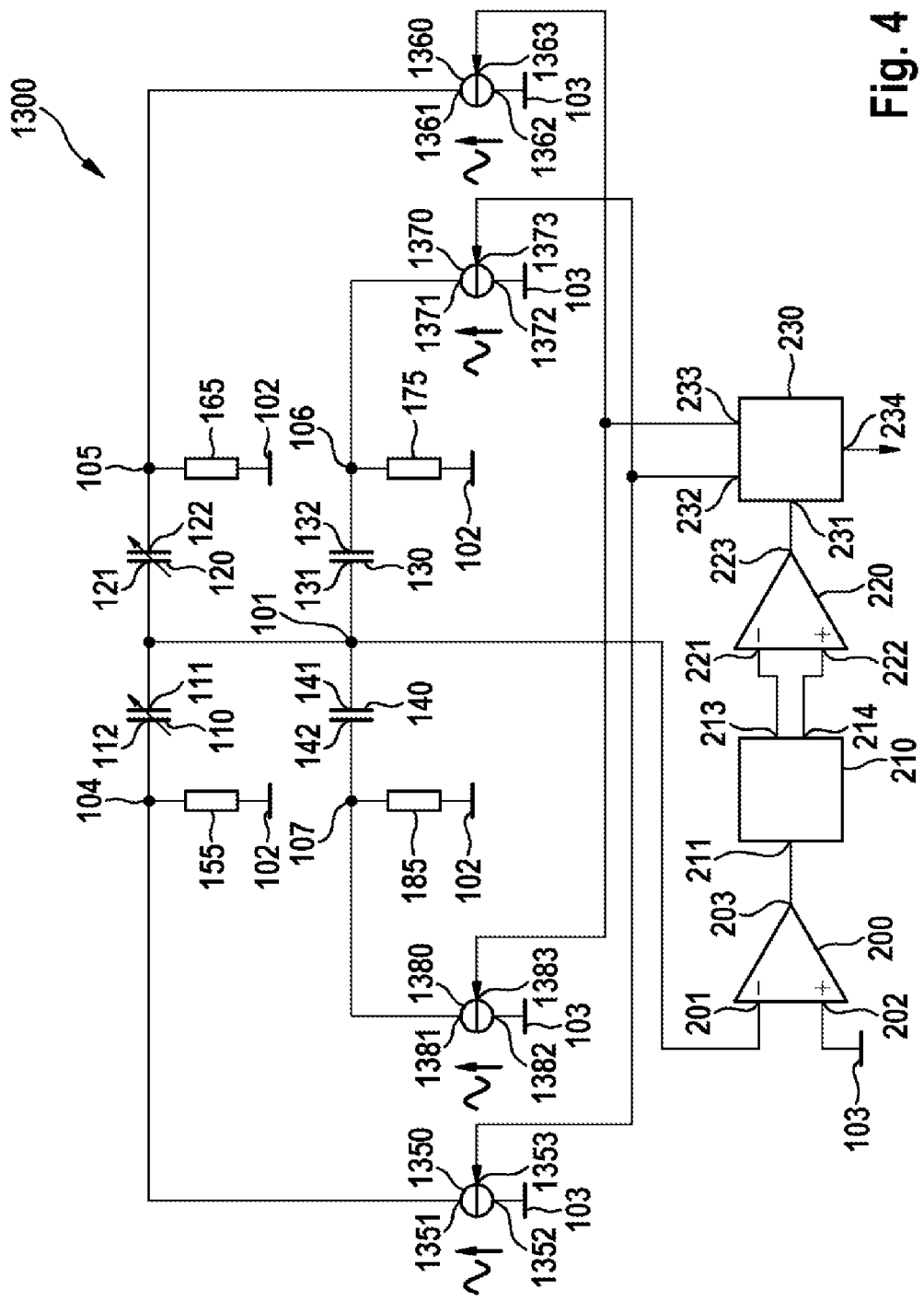
FIG. 4 shows a diagrammatic representation of a further alternative circuit arrangement.

FIG. 4 shows a diagrammatic representation of a further circuit arrangement 1300. Compared with the circuit arrangement 100 of FIG. 1, the direct-current sources 150, 160, 170, 180 and the switches 154, 164, 174, 184 are omitted in the circuit arrangement 1300. Instead, a first controllable alternating-current source 1350, a second controllable alternating-current source 1360, a third controllable alternating-current source 1370 and a fourth controllable alternating-current source 1380 are provided. The first alternating-current source 1350 has a first contact 1351, a second contact 1352, and a control contact 1353. The second alternating-current source 1360 has a contact 1361, a second contact 1362 and a control contact 1363. The third alternating-current source 1370 has a first contact 1371, a second contact 1372 and a control contact 1373. The fourth alternating-current source 1380 has a first contact 1381, a second contact 1382 and a control contact 1383. The second contacts 1352, 1362, 1372, 1382 of the alternating-current sources 1350, 1360, 1370, 1380 are connected in each case to the ground contact 103. The control contact 1353 of the first alternating-current source 1350 and the control contact 1373 of the third alternating-current source 1370 are connected to the first control signal output 232 of the control-value generator 230. The control contact 1263 of the second alternating-current source 1360 and the control contact 1383 of the fourth alternating-current source 1380 are connected to the second control signal output 233 of the control-value generator 230.

The first contact 1351 of the first alternating-current source 1350 is connected to the fourth circuit node 104. The first contact 1361 of the second alternating-current source 1360 is connected to the fifth circuit node 105. The first contact 1371 of the third alternating-current source 1370 is connected to the sixth circuit node 106. The first contact 1381 of the fourth alternating-current source 1380 is connected to the seventh circuit node 107.

Compared with the circuit arrangement 100 of FIG. 1, the clock generator 190 is omitted in the circuit arrangement 1300. The synchronous demodulator 210 is driven instead from a source synchronous with the alternating current generated by the first alternating-current source 1350.

A further essential advantage in the circuit arrangements 100, 1100, 1200, 1300 of FIGS. 1 to 4 is obtained if the values of the pull-up resistors 155, 165, 175, 185, the offset values $I_O$, the range values $I_A$ or the gain factors of the inverting amplifiers 1210 are designed to be adjustable. This enables the weight factors in equation 2 to be adapted to the respective measuring situation and in this manner, for example, the residual coupling $\epsilon$ introduced above to be kept at a predetermined value or to be adjusted to a value to be suitably determined.

If the circuit arrangement 100, 1100, 1200, 1300 is used in a capacitive beam detector, this option makes sense if the capacitance of a measuring capacitor changes, for example during an approach of the beam detector to a wall, by a value which is large compared with the typical changes in the measuring capacitance by the objects to be detected. The wall thus influences the change of the measuring signal obtained by objects because it leads to a change (typically an increase) in the residual coupling E. This consideration is based on the fact that the wall does not represent an object but a measuring environment. The change in the residual coupling $\epsilon$ depends on characteristics of the wall, for example, on the thickness, the material and the moisture of the wall.

By means of the described possibility of adjusting the residual coupling $\epsilon$, the residual coupling $\epsilon$ can be set to a predetermined value after placing the beam detector onto the wall. In this manner, the influence of the wall on the beam detector is compensated for and the objects to be detected provide a change in the measuring signal (the default value n) which is essentially independent of the wall.

The same advantage can be achieved if the capacitances of the reference capacitor 120 or the capacitances of the compensation capacitors 130, 140 are made adjustable.

If the residual coupling $\epsilon$ disappears, the default value n diverges without object to be detected, according to equation 1'. In practice, this finds expression in the fact that with decreasing residual coupling $\epsilon$, a noise of the default value n increases until, in the case of disappearing residual coupling $\epsilon$, the regulation performed by the circuit arrangement 100, 1100, 1200, 1300 fails and the default value n floats. It is thus advantageous to specify the residual coupling $\epsilon$ via the noise. Thus, for example, the residual coupling $\epsilon$ can be changed via the variation of the weight factors of the compensation capacitances until the noise assumes a certain value. In concrete terms, the noise can be determined, for example, as a standard deviation of a finite sequence of measurement values. If the standard deviation is greater than the predetermined value, the residual coupling $\epsilon$ is increased. If the standard deviation is less than the predetermined value, residual coupling $\epsilon$ is reduced. This can also take place iteratively.

The further processing of the default value n can be effected, in particular, by means of a microcontroller or a microprocessor.

The circuit arrangements 100, 1100, 1200, 1300 of FIGS. 1 to 4 can be used in capacitive detectors, especially in capacitive beam detectors. In the text which follows, floating capacitive beam detectors are explained which have circuit arrangements of the aforementioned type.

Floating beam detectors have at least two electrodes, an excitation signal being applied to one of the two electrodes (transmit electrode) and a current or a voltage being measured at the second electrode (receive electrode). As in the entire application, the term electrodes designates capacitor foils which are designed as conductive surfaces, for example, as metallic surfaces on a circuit board.

Figure 5:
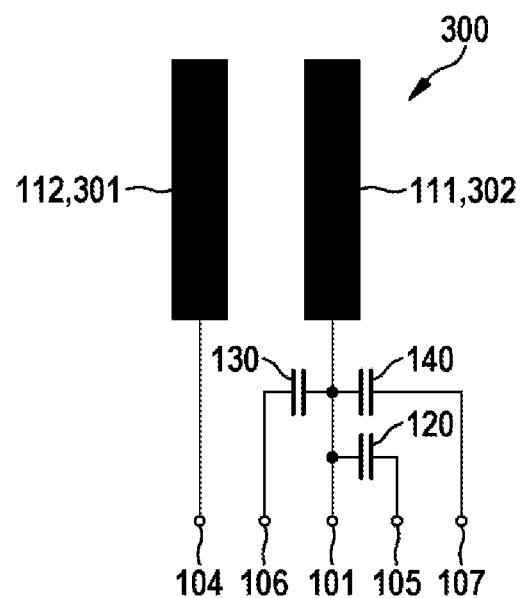
FIG. 5 shows a diagrammatic representation of a prototypical beam detector.

FIG. 5 shows in a diagrammatic representation a prototypical first beam detector 300. The first beam detector 300 has a first electrode 301, and a second electrode 302. In addition, the first beam detector 300 has a circuit arrangement 100, 1100, 1200, 1300 according to one of FIGS. 1 to 4. The first electrode 301 forms the second capacitor foil 112 of the first capacitor 110. The first electrode 301 is thus connected to the fourth circuit node 104. The second electrode 302 forms the first capacitor foil 111 of the first capacitor 110. The second electrode 302 is thus connected to the first circuit node 101 of the circuit arrangement 100. The second capacitor 120, the third capacitor 130 and the fourth capacitor 140 are designed as fixed-value capacitors.

The shape, size and relative positioning of the two electrodes 301, 302 follow the actual application of the first beam detector 300.

If the first beam detector 300 is brought close to an object, the capacitance of the first capacitor 110 formed by the electrodes 301, 302 changes which can be determined by the circuit arrangement 100, 1100, 1200, 1300 by a comparison with the constant reference capacitance of the capacitor 120. This type of measurement can be designated as absolute measurement.

Since the capacitance of the second capacitor 120 is constant in the first beam detector 300, it is possible to dispense with the fourth capacitor 140. The second capacitor 120 must then have a capacitance $C_{ref}$, the magnitude of which corresponds to the difference between the capacitances $C_{mess}$ of the first capacitor 110 and the capacitance $C_{komp,mess}$ of the third capacitor 130.

A beam detector can also have more than one transmitter electrode. Beam detectors having a number of transmit electrodes will be explained in the text which follows by means of FIGS. 6 to 9, 11 to 14, 19, 20 and 23 to 25. These beam detectors always have at least one first electrode, a second electrode and a third electrode. In this arrangement, the second electrode is always arranged between the first electrode and the third electrode. The first electrode always forms the second capacitor foil 112 of the first capacitor 110. The second electrode always forms the receive electrode which is connected to the first circuit node 101.

Figure 6:
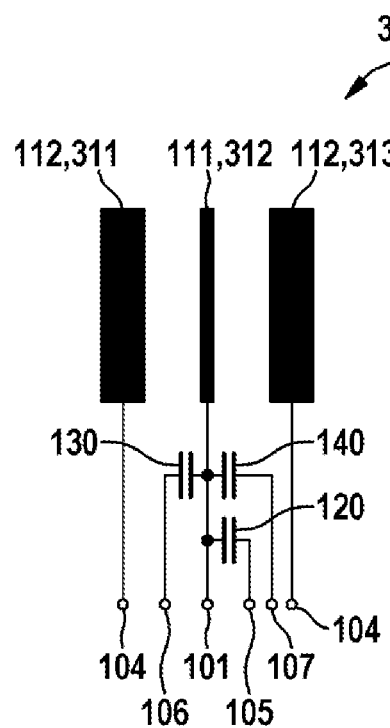
FIGS. 6 and 7 show diagrammatic representations of two beam detectors for absolute measurements with two excited electrodes.

FIG. 6 shows a diagrammatic representation of a second beam detector 310. The second beam detector 310 has a first electrode 311, a second electrode 312 and a third electrode 313. The first electrode 311 and the third electrode 313 jointly form the second capacitor foil 112 of the first capacitor 110. The second electrode 311 forms the first capacitor foil 111 of the first capacitor 110. The second capacitor 120, the third capacitor 130 and the fourth capacitor 140 are designed as fixed-value capacitors. The second beam detector 310 of FIG. 6 has advantageously a symmetric design.

Figure 7:
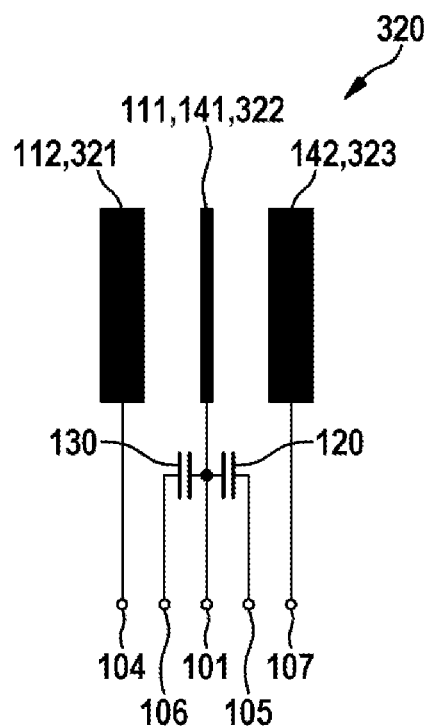

FIG. 7 shows a diagrammatic representation of a third beam detector 320. The third beam detector 320 has a first electrode 321, a second electrode 322 and a third electrode 323. The first electrode 321 forms the second capacitor foil 112 of the first capacitor 110. The third electrode 323 forms the second capacitor foil 142 of the fourth capacitor 140. The second electrode 322 forms the first capacitor foil 111 of the first capacitor 110 and the first capacitor foil 141 of the fourth capacitor 140. The second capacitor 120 and the third capacitor 130 are designed as fixed-value capacitors.

In the case of the third beam detector 320, it is not only the capacitance $C_{mess}$ of the first capacitor 110 but also the capacitance $C_{komp,ref}$ of the fourth capacitor 140 which changes when the third beam detector 320 approaches an object. In the case of the third beam detector 320, the capacitance $C_{ref}$ of the second capacitor 120 must be selected, therefore, to be of such a magnitude that the capacitance $C_{komp,ref}$ of the fourth capacitor is less than the capacitance $C_{ref}$ of the second capacitor 120 in all regular cases of application of the third beam detector 320.

The capacitances $C_{mess}$ of the first capacitor 110 and $C_{komp,ref}$ of the fourth capacitor 140 are variable with a fixed component $C_{mess,0}$, $C_{komp,ref,0}$ and variable components $\Delta_{mess}$ and $\Delta_{komp,ref}$. Selecting $C_{komp,mess}=C_{mess,0}-\epsilon$ and $C_{ref}=C_{komp,ref,0}+\epsilon$ then results in $$n = \frac{I_0(\Delta_{mess} + \Delta_{komp,ref})}{I_\Delta(2\epsilon + \Delta_{mess} - \Delta_{komp,ref})}.$$

If $\Delta_{mess}$ is equal to $\Delta_{komp,ref}$, the default value n is advantageously linear. In addition, the sensitivity of the third beam detector 320 is then advantageously independent of the magnitude of the default value n, that is to say of the magnitude of the measurement value.

If in the third beam detector 320, the control signal $I_1$ is selected to be constant and only the second control signal $I_2$ is controlled, the default value n is given by $$n = \frac{I_0(\Delta_{mess} + \Delta_{komp,mess})}{I_\Delta(\epsilon - \Delta_{komp,ref})}.$$

If, in contrast, the second control signal $I_2$ is selected to be constant and only the first control signal $I_1$ is controlled, the default value n is obtained as $$n = \frac{I_0(\Delta_{mess} + \Delta_{komp,mess})}{I_\Delta(\epsilon + \Delta_{mess})}.$$

FIG. 8 shows a diagrammatic representation of a fourth beam detector 330. The fourth beam detector 330 has a first electrode 331, a second electrode 332 and a third electrode 333. The first electrode 331 forms the second capacitor foil 112 of the first capacitor 110. The third electrode 333 forms the second capacitor foil 122 of the second capacitor 120. The second electrode 332 forms the first capacitor foil 111 of the first capacitor 110 and the first capacitor foil 121 of the second capacitor 120. The third capacitor 130 and the fourth capacitor 140 are designed as fixed-value capacitors.

In the case of the fourth beam detector 330, the capacitances $C_{mess}$ of the first capacitor 110 and $C_{ref}$ of the second capacitor 120 are thus variable. The default value n is given by $$n = \frac{I_0(\Delta_{mess} - \Delta_{ref})}{I_\Delta(2\epsilon + \Delta_{mess} + \Delta_{ref})}.$$

FIG. 9 shows a diagrammatic representation of a fifth beam detector 340. The first electrode 341 of the fifth beam detector 340 forms the second capacitor foil 112 of the first capacitor 110. A third electrode 343 of the fifth beam detector 340 forms the second capacitor foil 132 of the third capacitor 130. A second electrode 342 of the fifth beam detector 340 forms the first capacitor foil 111 of the first capacitor 110 and the first capacitor foil 131 of the third capacitor 130. The second capacitor 120 and the fourth capacitor 140 are designed as fixed-value capacitors.

In the case of the fifth beam detector 340, the capacitances $C_{mess}$ of the first capacitor 110 and $C_{komp,mess}$ of the third capacitor 130 are thus variable. If it applies, for reasons of symmetry, that the couplings of the two transmit electrodes 341, 343 with the receive electrode 342 are of equal magnitude, it can be ensured by an additional constant capacitance at the fourth circuit node 104 that $C_{mess}$ is greater than $C_{komp,mess}$. The difference of the capacitance $C_{ref}$ of the second capacitor 120 and of the capacitance $C_{komp,ref}$ of the fourth capacitor 140 is then selected in the magnitude of this additional constant capacitance. The default value n is then obtained as $$n = \frac{I_0(\Delta_{mess} - \Delta_{komp,mess})}{I_\Delta(2\varepsilon + \Delta_{mess} - \Delta_{komp,mess})}.$$

If the first control signal $I_1$ is selected to be constant and only the second control signal $I_2$ is controlled, the default value n is given by $$n = \frac{I_0(\Delta_{mess} - \Delta_{komp,mess})}{I_\Delta \varepsilon}.$$

In the case of the first beam detector 300, the second beam detector 310, the third beam detector 320, the fourth beam detector 330 and the fifth beam detector 340, the capacitors designed as fixed-value capacitors can also be formed by pairs of electrodes. In this context, it is only essential that the capacitance of these fixed-value capacitors is not influenced by objects or the measuring environment or this influence is very small compared with the influence on the variable capacitances of the beam detectors 300, 310, 320, 330, 340.

The first beam detector 300 of FIG. 5, the second beam detector 310 of FIG. 6 and the third beam detector 320 of FIG. 7 are suitable for performing absolute measurements. The fourth beam detector 330 of FIG. 8 and the fifth beam detector 340 of FIG. 9 are suitable for performing differential measurements. FIG. 10 shows a diagrammatic measurement value variation 500 for explaining the difference between these principles of measurement. On a horizontal axis of the graph of FIG. 10, a location coordinate 501 is plotted. On a vertical axis 502 of the graph, the default value n is shown. The location coordinate 501 corresponds to the spatial direction in which the electrodes of the beam detectors 300, 310, 320, 330, 340 are arranged next to one another. If an object is moved through in the direction of the location coordinate 501 underneath the beam detectors 300, 310, 320, 330, 340, the course of the default value n according to the absolute measurement 510 is obtained in the first beam detector 300, in the second beam detector 310 and in the third beam detector 320. In the case of the fourth beam detector 330 and in the case of the fifth beam detector 340, the course of the default value n according to the differential measurement 520 is obtained.

The dependence of the default value n on changes in capacitance of the capacitors 110, 120, 130, 140 is represented as follows: if the capacitive coupling between the first capacitor foil 111 and the second capacitor foil 112 of the first capacitor 110 increases, more current flows in the first phase and the default value n decreases. If the capacitive coupling between the first capacitor foil 121 and the second capacitor foil 122 of the second capacitor 120 increases, more current flows during the second phase and the default value n increases. If the capacitive coupling between the first capacitor foil 131 and the second capacitor foil 132 of the third capacitor 130 increases, less current flows during the first phase and the default value n increases. If the capacitive coupling between the first capacitor foil 141 and the second capacitor foil 142 of the fourth capacitor 140 increases, less current flows during the second phase and the default value n decreases.

FIGS. 11 to 14 show further examples of beam detectors which are suitable for performing differential measurements. FIGS. 19, 20, 23, 24 and show further examples of beam detectors which are suitable for performing absolute measurements. All these beam detectors have five electrodes overall. In this context, it also applies that the second electrode is arranged between the first electrode and the third electrode. Additionally, the fourth electrode is arranged between the first electrode and the second electrode in these beam detectors. The fifth electrode is arranged between the second electrode and the third electrode.

Figure 11:
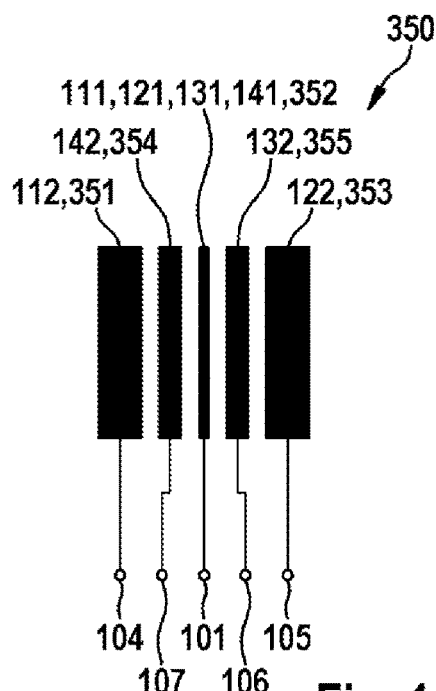
FIGS. 11 to 14 show diagrammatic representations of beam detectors with five electrodes for differential measurements.

FIG. 11 shows a diagrammatic representation of a sixth beam detector 350. A first electrode 351 forms the second capacitor foil 112 of the first capacitor 110. A fourth electrode 354 forms the second capacitor foil 142 of the fourth capacitor 140. A fifth electrode 355 forms the second capacitor foil 132 of the third capacitor 130. A third electrode 353 forms the second capacitor foil 122 of the second capacitor 120. A second electrode 352 forms the first capacitor foil 111 of the first capacitor 110, the first capacitor foil 121 of the second capacitor 120, the first capacitor foil 131 of the third capacitor 130 and the first capacitor foil 141 of the fourth capacitor 140.

Figure 12:
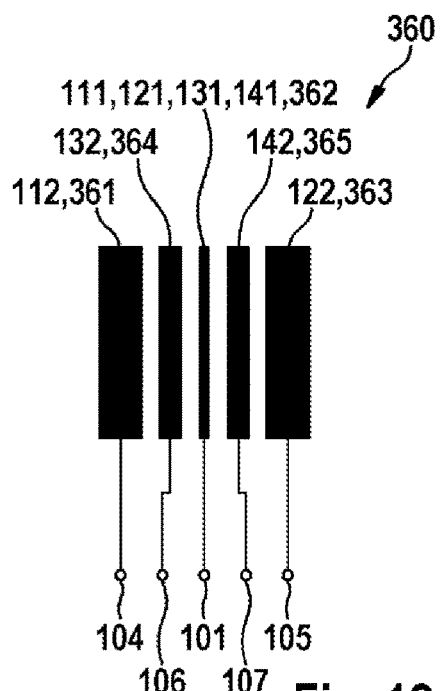

FIG. 12 shows a diagrammatic representation of a seventh beam detector 360. A first electrode 361 forms the second capacitor foil 112 of the first capacitor 110. A fourth electrode 364 forms the second capacitor foil 132 of the third capacitor 130. A fifth electrode 365 forms the second capacitor foil 142 of the fourth capacitor 140. A third electrode 363 forms the second capacitor foil 122 of the second capacitor 120. A second electrode 362 forms the first capacitor foils 111, 121, 131, 141 of the capacitors 110, 120, 130, 140.

Figure 13:
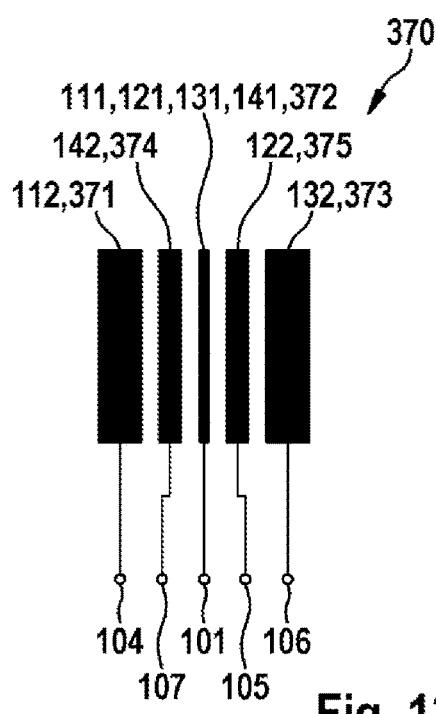

FIG. 13 shows a diagrammatic representation of an eighth beam detector 370. A first electrode 371 forms the second capacitor foil 112 of the first capacitor 110. A fourth electrode 374 forms the second capacitor foil 142 of the fourth capacitor 140. A fifth electrode 375 forms the second capacitor foil 122 of the second capacitor 120. A third electrode 373 forms the second capacitor foil 132 of the third capacitor 130. A second electrode 372 forms the first capacitor foils 111, 121, 131, 141 of the four capacitors 110, 120, 130, 140.

Figure 14:
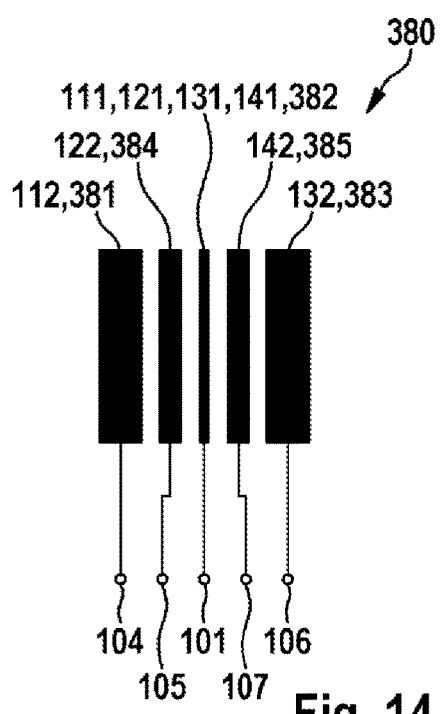

FIG. 14 shows a diagrammatic representation of a ninth beam detector 380. A first electrode 381 forms the second capacitor foil 112 of the first capacitor 110. A fourth electrode 384 forms the second capacitor foil 122 of the second capacitor 120. A fifth electrode 385 forms the second capacitor foil 142 of the fourth capacitor 140. A third electrode 383 forms the second capacitor foil 132 of the third capacitor 130. A second electrode 382 forms the first capacitor foils 111, 121, 131, 141 of the four capacitors 110, 120, 130, 140.

FIGS. 15 to 18 show in a diagrammatic representation the zones of influence of the different electrodes of the beam detectors 350, 360, 370, 380 of FIGS. 11 to 14.

Figure 15:
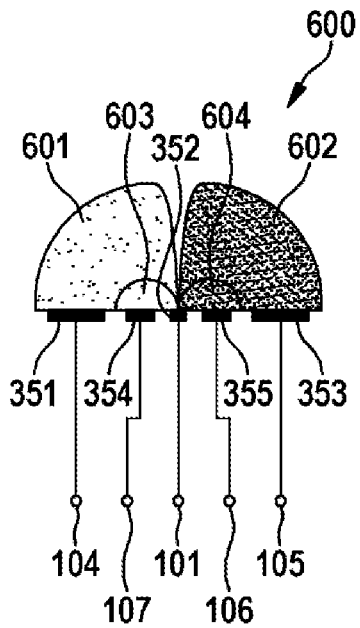
FIGS. 15 to 18 show diagrammatic representations of the measuring characteristic of the beam detectors.

FIG. 15 shows a first measuring characteristic 600 of the sixth beam detector 350 of FIG. 11. A first zone of influence 601 diagrammatically shows the zone of influence of the first electrode 351. An object located within the first zone of influence 601 reduces the default value n. An object located in a second zone of influence 602 of the third electrode 353 increases the default value n. An object located in a third zone of influence 603 of the fourth electrode 354 reduces the default value n. An object located in a fourth zone of influence 604 of the fifth electrode 355 of the sixth beam detector 350 increases the default value n.

Figure 16:
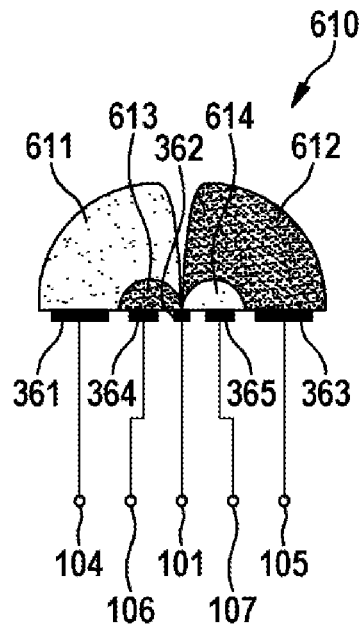

FIG. 16 shows a second measuring characteristic 610 of the seventh beam detector 360. An object located in a first zone of influence 611 of the first electrode 361 reduces the default value n. An object located in a second zone of influence 612 of the third electrode 363 increases the default value n. An object located in a third zone of influence 613 of the fourth electrode 364 also increases the default value n. An object located in a fourth zone of influence 614 of the fifth electrode 365 reduces the default value n.

Figure 17:
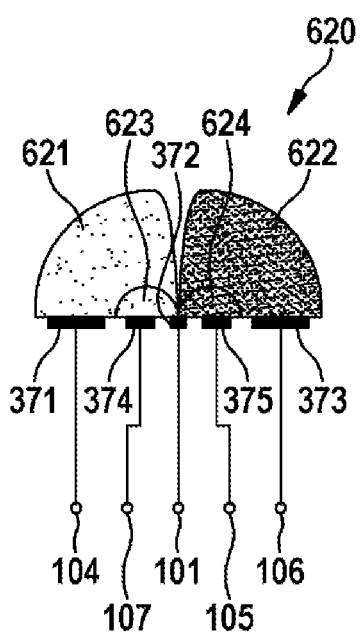

FIG. 17 shows in a diagrammatic representation a third measuring characteristic 620 of the eighth beam detector 370. An object located in a first zone of influence 621 of the first electrode 371 reduces the default value n. An object located in a second zone of influence 622 of the third electrode 373 increases the default value n. An object located in a third zone of influence 623 of the fourth electrode 374 reduces the default value n. An object located in a fourth zone of influence 624 of the fifth electrode 375 increases the default value n.

Figure 18:
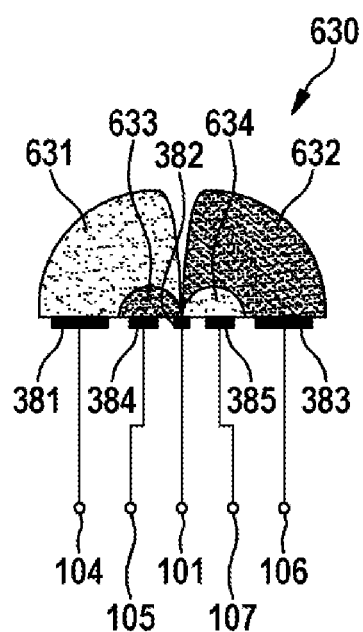

FIG. 18 shows in a diagrammatic representation a fourth measuring characteristic 630 of the ninth beam detector 380 of FIG. 14. An object located in a first zone of influence 631 of the first electrode 381 reduces the default value n. An object located in a second zone of influence 632 of the third electrode 383 increases the default value n. An object located in a third zone of influence 633 of the fourth electrode 384 also increases the default value n. An object located in a fourth zone of influence 634 of the fifth electrode 385 reduces the default value n.

Figure 19:
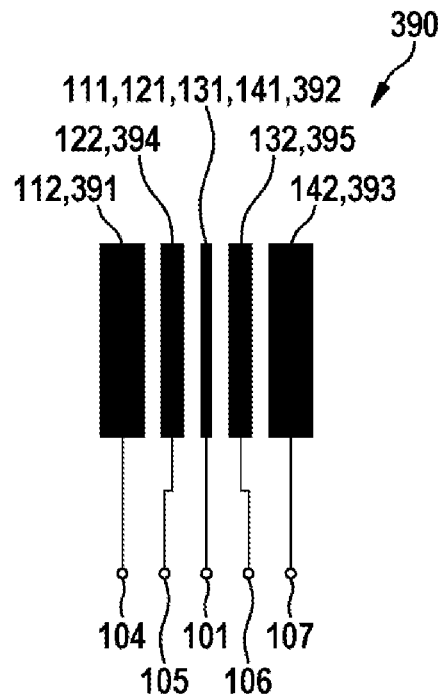
FIGS. 19 and 20 show diagrammatic representations of beam detectors with five electrodes for absolute measurements.

FIG. 19 shows in a diagrammatic representation a tenth beam detector 390. A first electrode 391 forms the second capacitor foil 112 of the first capacitor 110. A fourth electrode 394 forms the second capacitor foil 122 of the second capacitor 120. A fifth electrode 395 forms the second capacitor foil 132 of the third capacitor 130. A third electrode 393 forms the second capacitor foil 142 of the fourth capacitor 140. A second electrode 392 forms the first capacitor foils 111, 121, 131, 141 of the four capacitors 110, 120, 130, 140.

Figure 20:
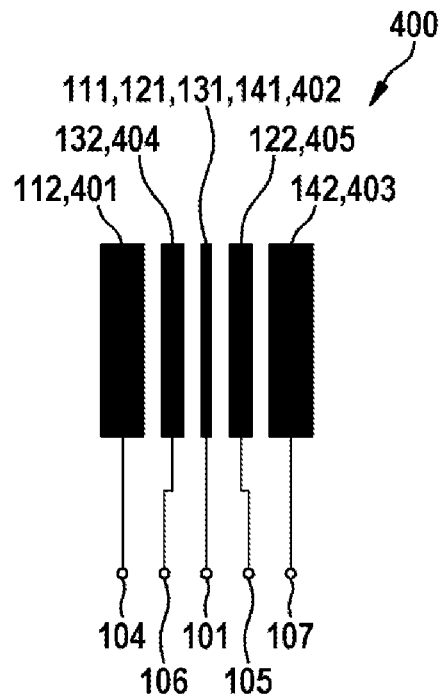

FIG. 20 shows in a diagrammatic representation a eleventh beam detector 400. A first electrode 401 forms the second capacitor foil 112 of the first capacitor 110. A fourth electrode 404 forms the second capacitor foil 132 of the third capacitor 130. A fifth electrode 405 forms the second capacitor foil 122 of the second capacitor 120. A third electrode 403 forms the second capacitor foil 142 of the fourth capacitor 140. A second electrode 402 forms the first capacitor foils 111, 121, 131, 141 of the four capacitors 110, 120, 130, 140.

Figure 21:
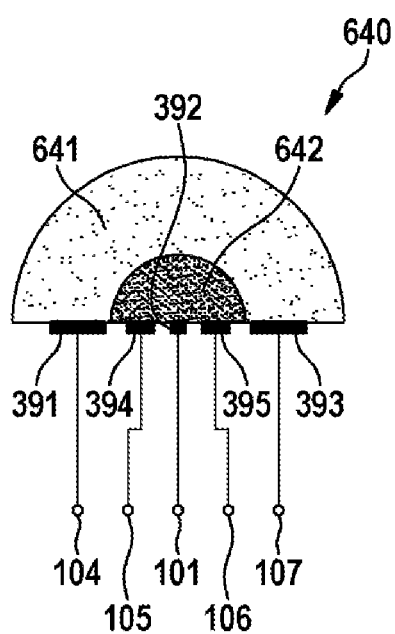
FIGS. 21 and 22 show diagrammatic representations of the measuring characteristic of these beam detectors.

FIG. 21 shows in a diagrammatic representation a fifth measuring characteristic 640 of the tenth beam sensor 390 of FIG. 19. In an outer zone of influence 641 of the first electrode 391 and of the third electrode 393, the default value n drops when an object penetrates. If an object passes into an inner zone of influence 642 of the fourth electrode 394 and of the fifth electrode 395, the default value n rises.

Figure 22:
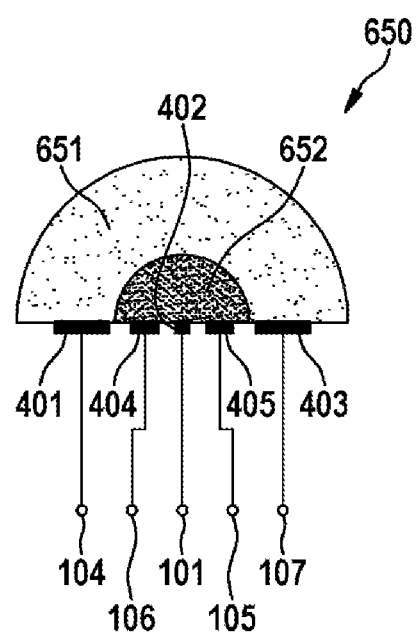

FIG. 22 shows a diagrammatic sixth measuring characteristic 650 of the eleventh beam detector 400 of FIG. 20. If an object passes into an outer zone of influence 651 of the first electrode 401 and of the third electrode 403, the default value n drops. If an object passes into an inner zone of influence 652 of the fourth electrode 404 and of the fifth electrode 405, the default value n rises.

Figure 23:
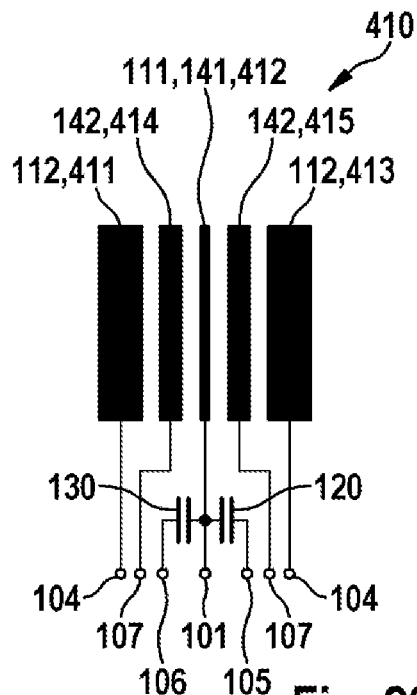
FIGS. 23, 24 and 25 show diagrammatic representations of further beam detectors having five electrodes for absolute measurements.

FIG. 23 shows a diagrammatic representation of a twelfth beam detector 410. A first electrode 411 and a third electrode 413 jointly form the second capacitor foil 112 of the first capacitor 110. A fourth electrode 414 and a fifth electrode 415 jointly form the second capacitor foil 142 of the fourth capacitor 140. A second electrode 412 forms the first capacitor foil 111 of the first capacitor 110 and the first capacitor foil 141 of the fourth capacitor 140. The second capacitor 120 and the third capacitor 130 are designed as fixed-value capacitors.

Figure 24:
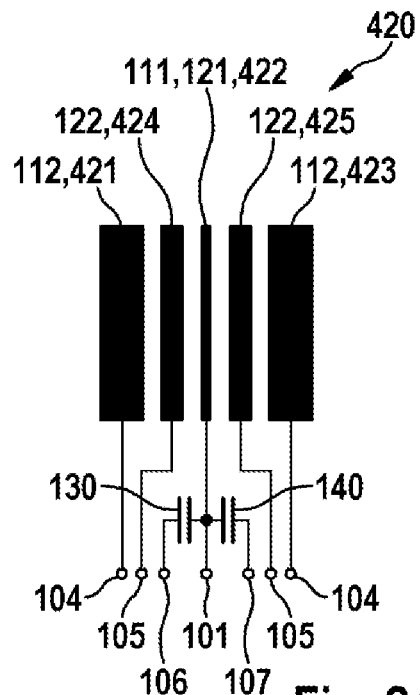

FIG. 24 shows a diagrammatic representation of a thirteenth beam detector 420. A first electrode 421 and a third electrode 423 jointly form the second capacitor foil 112 of the first capacitor 110. A fourth electrode 424 and a fifth electrode 425 jointly form the second capacitor foil 122 of the second capacitor 120. A second electrode 422 forms the first capacitor foil 111 of the first capacitor 110 and the first capacitor foil 121 of the second capacitor 120. The third capacitor 130 and the fourth capacitor 140 are designed as fixed-value capacitors.

Figure 25:
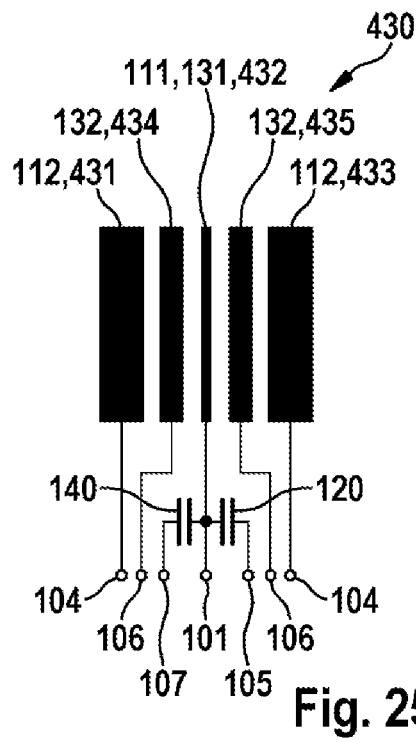

FIG. 25 shows a diagrammatic representation of a fourteenth beam detector 430. A first electrode 431 and a third electrode 433 jointly form the second capacitor foil 112 of the first capacitor 110. A fourth electrode 434 and a fifth electrode 435 jointly form the second capacitor foil 132 of the third capacitor 130. A second electrode 432 forms the first capacitor foil 111 of the first capacitor 110 and the first capacitor foil 131 of the third capacitor 130. The second capacitor 120 and the fourth capacitor 140 are designed as fixed-value capacitors.

Figure 26:
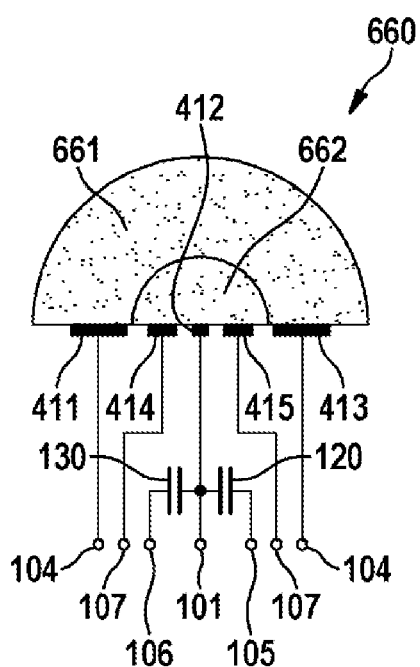
FIGS. 26, 27 and 28 show diagrammatic representations of the measuring characteristic of these beam detectors.

FIG. 26 shows in a diagrammatic representation a seventh measuring characteristic 660 of the twelfth beam detector 410 of FIG. 23. If an object passes into an outer zone of influence 661 of the first electrode 411 and of the third electrode 413, the default value n drops. If an object passes into an inner zone of influence 662 of the fourth electrode 414 and of the fifth electrode 415, the default value n also drops.

Figure 27:
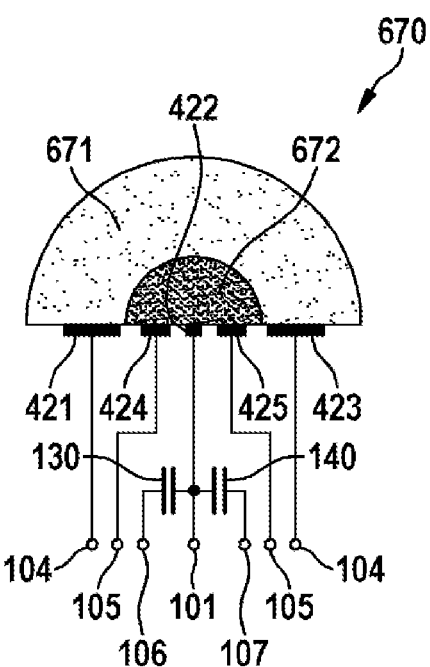

FIG. 27 shows a diagrammatic eighth measuring characteristic 670 of the thirteenth beam detector 420. If an object passes into an outer zone of influence 671 of the first electrode 421 and of the third electrode 423, the default value n drops. If an object passes into an inner zone of influence 672 of the fourth electrode 424 and of the fifth electrode 425, the default value n rises.

Figure 28:
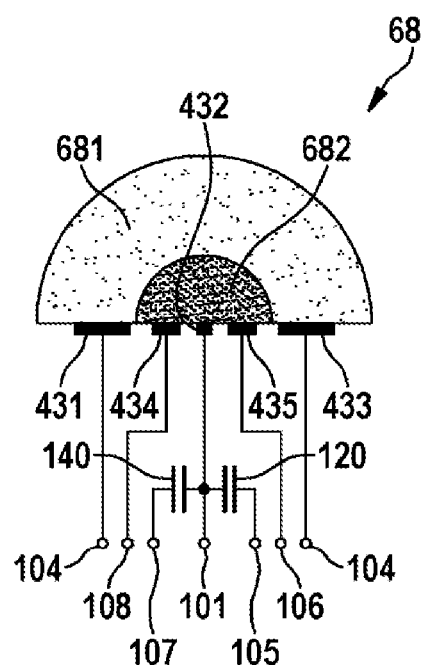

FIG. 28 shows a diagrammatic ninth measuring characteristic 680 of the fourteenth beam detector 430 of FIG. 25. If an object passes into an outer zone of influence 681 of the first electrode 431 and of the third electrode 433, the default value n drops. If an object passes into an inner zone of influence 682 of the fourth electrode 434 and of the fifth electrode 435, the default value n rises.

The beam detectors 350, 360, 370, 380, 390, 400, 410, 420, 430 shown in FIGS. 11 to 14, 19, 20 and 23 to 25 can be reduced to four cases with regard to the voltages present at the electrodes. FIGS. 29 to 32 show electric fields 700 which are produced in these four cases. In each case a first electrode 701, a second electrode 702, a third electrode 703, a fourth electrode 704 and a fifth electrode 705 are shown. The five electrodes 701, 702, 703, 704, 705 are arranged next to one another along a first space coordinate 706, the first electrode 701, the fourth electrode 704, the second electrode 702, the fifth electrode 705 and the third electrode 703 following one another in this order. A second space coordinate 707 is oriented perpendicularly to the first space coordinate 706 and perpendicularly to the plane of the electrodes 701, 702, 703, 704, 705.

Figure 29:
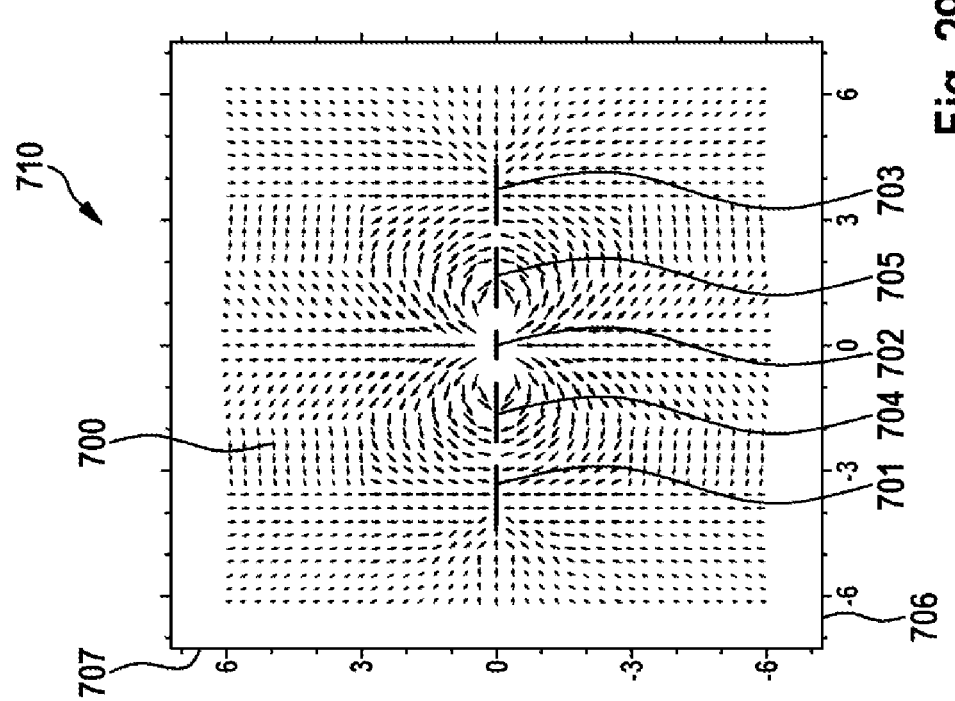

A first potential distribution 710 shown in FIG. 29 is obtained in the case where the same potential is present at all four transmit electrodes 701, 704, 705, 703. This case can be understood to be an absolute classical measurement.

Figure 30:
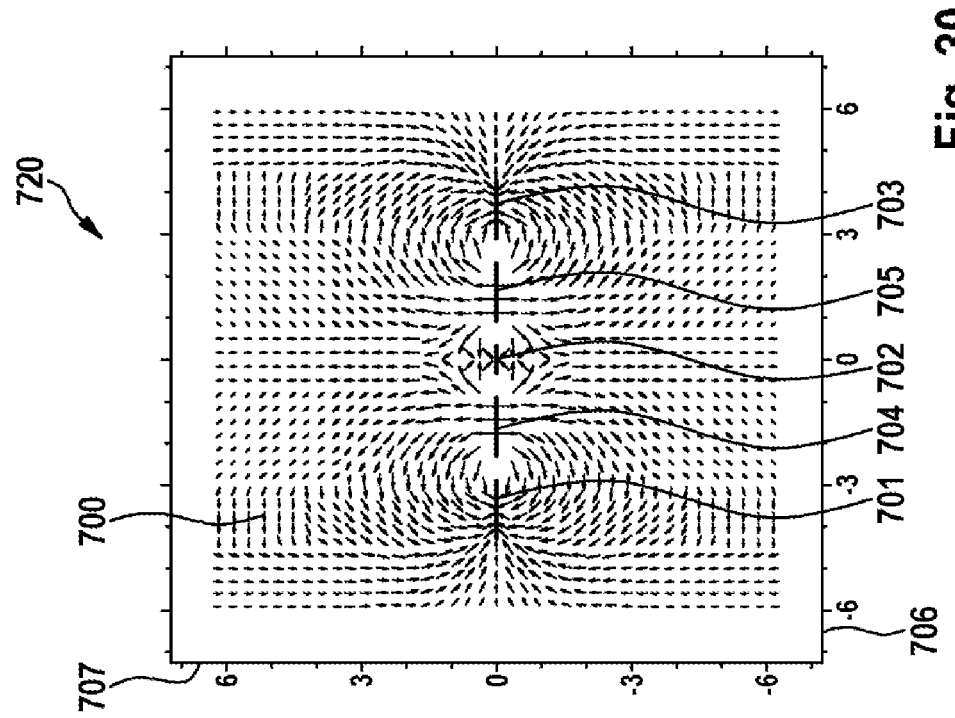
FIGS. 29 to 32 show electrical fields which are obtained for beam detectors of different configurations.

A second potential distribution 720 shown in FIG. 30 is obtained in the case where the same potential is present in each case at the transmit electrodes 701, 704 on the left and at the transmit electrodes 705, 703 on the right of the receive electrodes 702 but the sign differs between the left pair 701, 704 and the right pair 705, 703. This case can be understood to be a differential classical measurement.

Figure 31:
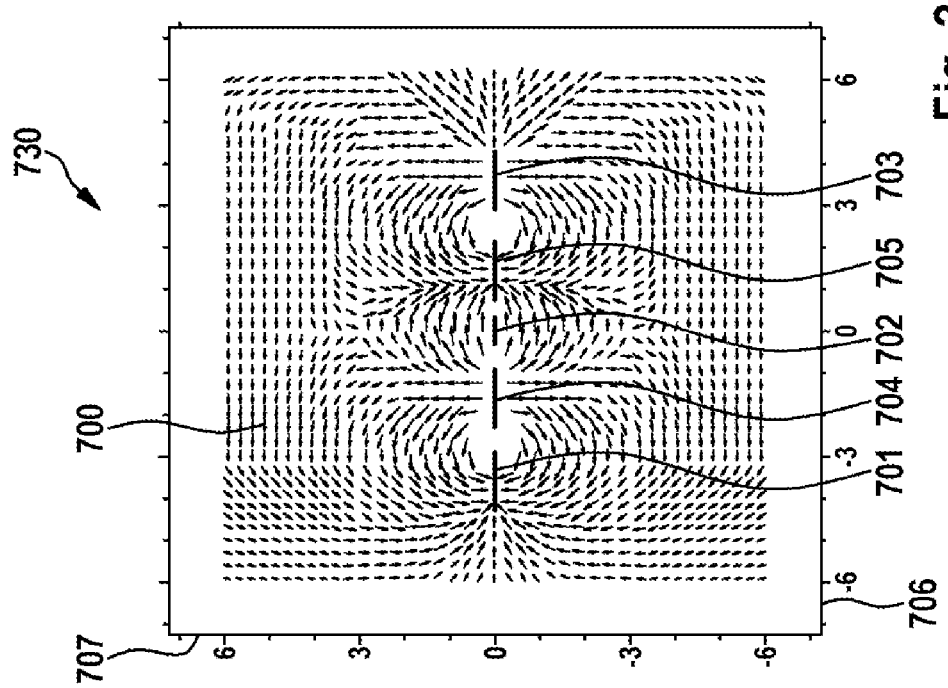

A third potential distribution 730 shown in FIG. 31 is obtained in the case where the same potential is present in each case at the outer transmit electrodes 701, 703 and the inner transmit electrodes 704, 705 but the signs differ between the outer pair 701, 703 and the inner pair 704, 705. This case can be understood to be an absolute progressive measurement.

Figure 32:
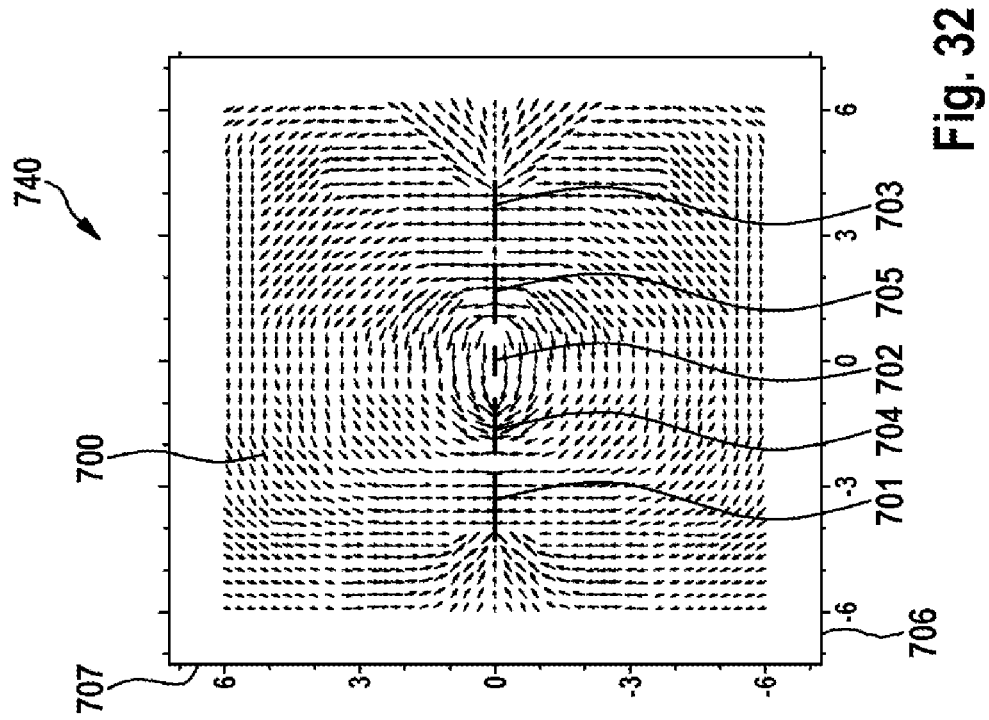

A fourth potential distribution 740 shown in FIG. 32 is obtained in the case where the advantages of the potentials differ both between the transmit electrodes 701, 704 and 705, 703, on the one hand, and between the outer transmit electrodes 701, 703 and between the inner transmit electrodes 704, 705. This case can be understood to be a differential progressive measurement.

The third potential distribution 730 and the fourth potential distribution 740 allow a dependence of the sign of the change of the default value n on the distance of an object perpendicularly to the beam detector. The variations of the electrical field 700 shown have in each case a point at which the electrical fields 700 become extinguished. The distance from the beam detector at which such a change of sign of the change of the default value n occurs can be influenced via the geometry of the electrodes and via the voltages applied to the electrodes. At the distance characterized by the change of sign, the beam detector is blind. In a capacitive beam detector, this characteristic can be utilized advantageously for rendering the beam detector more robust against particular disturbances. These include inhomogeneities of the wall material and an unintended tilting of the beam detector at the wall surface as may occur, for example, due to faulty handling by the user, by a rough wall surface or for other reasons. By this means, the reliability of the beam detector can be improved advantageously distinctly compared with the prior art.

The invention claimed is:

1. A circuit arrangement comprising:
a first capacitor, a second capacitor, and a third capacitor, each of the first capacitor, the second capacitor, and the third capacitor having a first capacitor foil connected to a first circuit node, the first capacitor being supplied with a first time-dependent voltage, the second capacitor being supplied with a second time-dependent voltage, the third capacitor being supplied with a third time-dependent voltage, the first time-dependent voltage and the second time-dependent voltage being clocked in antiphase, the second time-dependent voltage and the third time-dependent voltage being clocked in phase;
an amplifier having inputs connected to the first circuit node and to a ground contact, the amplifier being configured to generate an output signal;
a comparator having two inputs, the comparator being configured to generate an output value; and
a synchronous demodulator configured to apply the output signal of the amplifier synchronously with a clock of the first time-dependent voltage alternately to the two inputs of the comparator,
wherein the circuit arrangement is configured to (i) generate a control value in dependence on the output value of the comparator and (ii) at least one of change amplitudes of the first time-dependent voltage and the third time-dependent voltage in dependence on the control value and change an amplitude of the second time-dependent voltage in dependence on the control value.

2. The circuit arrangement as claimed in claim 1, further comprising:
a fourth capacitor having a first capacitor foil connected to the first circuit node, the fourth capacitor being supplied with a fourth time-dependent voltage, the first time-dependent voltage and the fourth time-dependent voltage being clocked in phase.

3. The circuit arrangement as claimed in claim 1, further comprising:
a controllable direct-current source operably connected between the ground contact and a second capacitor foil of one of the first capacitor, the second capacitor, the third capacitor, and the fourth capacitor;
a resistor operably connected between the second capacitor foil of the one of the first capacitor, the second capacitor, the third capacitor, and the fourth capacitor and a second circuit node, the second circuit node having constant voltage potential that is greater than a voltage potential of the ground contact; and
a switch operably connected between the direct-current source and the second capacitor foil.

4. The circuit arrangement as claimed in claim 2, further comprising:
a first controllable direct-current source having a first contact and a second contact, the second contact being connected to the ground contact;
a first switch operably connected between a second capacitor foil of the first capacitor and the first contact of the first controllable direct-current source;
a first resistor operably connected between the second capacitor foil of the first capacitor and the second current node;
a second controllable direct-current source having a first contact and a second contact, the second contact being connected to the ground contact;
a second switch operably connected between a second capacitor foil of the second capacitor and the first contact of the second controllable direct-current source;
a second resistor operably connected between the second capacitor foil of the second capacitor and the second current node;
a third controllable direct-current source having a first contact and a second contact, the second contact being connected to the ground contact;
a third switch operably connected between a second capacitor foil of the third capacitor and the first contact of the third controllable direct-current source;

a third resistor operably connected between the second capacitor foil of the third capacitor and the second current node;

a fourth controllable direct-current source having a first contact and a second contact, the second contact being connected to the ground contact;

a fourth switch operably connected between a second capacitor foil of the fourth capacitor and the first contact of the fourth controllable direct-current source; and a fourth resistor operably connected between the second capacitor foil of the fourth capacitor and the second current node.

5. The circuit arrangement as claimed in claim 3, further comprising:

an inverting amplifier having an inverting input, a non-inverting input, and an output, the inverting input being connected to the second capacitor foil of the one of the first capacitor, the second capacitor, the third capacitor, and the fourth capacitor via a first resistor, the non-inverting input being connected to a third circuit node, the third circuit node having a constant voltage potential which is centrally between the voltage potential of the second circuit node and the voltage potential of the ground contact, the output being connected to the inverting input via a second resistor and to a second capacitor foil of another of the one of the first capacitor, the second capacitor, the third capacitor, and the fourth capacitor.

6. The circuit arrangement as claimed in claim 1, further comprising:

a controllable direct-voltage source operably connected between the ground contact and a second capacitor foil of one of the first capacitor, the second capacitor, the third capacitor, and the fourth capacitor; and a second switch operably connected between the direct-voltage source and the second capacitor foil of the one of the first capacitor, the second capacitor, the third capacitor, and the fourth capacitor, the second switch being configured to connect the second capacitor foil of the one of the first capacitor, the second capacitor, the third capacitor, and the fourth capacitor either to the controllable direct-voltage source or to the ground contact.

7. The circuit arrangement as claimed in claim 1, further comprising:

a clock generator configured to (i) generate a clock signal and a push-pull signal that is inverse to the clock signal, (ii) drive the synchronous demodulator with the clock signal, (iii) clock the first time-dependent voltage with the clock signal, and (iv) clock the second time-dependent voltage with the push-pull signal.

8. The circuit arrangement as claimed in claim 1, further comprising:

a controllable alternating-current source operably connected between the ground contact and a second capacitor foil of one of the first capacitor, the second capacitor, the third capacitor, and the fourth capacitor; and a resistor operably connected between the second capacitor foil of the one of the first capacitor, the second capacitor, the third capacitor, and the fourth capacitor and a second circuit node, the second circuit node having constant voltage potential that is greater than a voltage potential of the ground contact.

9. The circuit arrangement as claimed in claim 1, wherein the comparator is one of an integrating comparator and a sample-and-hold comparator.

10. A beam detector comprising:

a circuit arrangement, the circuit arrangement comprising:

a first capacitor, a second capacitor, and a third capacitor, each of the first capacitor, the second capacitor, and the third capacitor having a first capacitor foil connected to a first circuit node, the first capacitor being supplied with a first time-dependent voltage, the second capacitor being supplied with a second time-dependent voltage, the third capacitor being supplied with a third time-dependent voltage, the first time-dependent voltage and the second time-dependent voltage being clocked in antiphase, the second time-dependent voltage and the third time-dependent voltage being clocked in phase;

an amplifier having inputs connected to the first circuit node and to a ground contact, the amplifier being configured to generate an output signal;

a comparator having two inputs, the comparator being configured to generate an output value; and a synchronous demodulator configured to apply the output signal of the amplifier synchronously with a clock of the first time-dependent voltage alternately to the two inputs of the comparator, wherein the circuit arrangement is configured to (i) generate a control value in dependence on the output value of the comparator and (ii) at least one of change amplitudes of the first time-dependent voltage and the third time-dependent voltage in dependence on the control value and change an amplitude of the second time-dependent voltage in dependence on the control value.

11. The beam detector as claimed in claim 10, further comprising:

a first electrode configured to form a second capacitor foil of the first capacitor of the circuit arrangement; and a second electrode configured to form the first capacitor foil of the first electrode of the circuit arrangement.

12. The beam detector as claimed in claim 11, further comprising:

a third electrode, the first electrode and the third electrode jointly forming the second capacitor foil of the first capacitor.

13. The beam detector as claimed in claim 12, wherein:

the circuit arrangement further comprises:

a fourth capacitor having a first capacitor foil connected to the first circuit node, the fourth capacitor being supplied with a fourth time-dependent voltage, the first time-dependent voltage and the fourth time-dependent voltage being clocked in phase, the beam detector further comprises:

a fourth electrode; and a fifth electrode, the fourth electrode and the fifth electrode jointly form a second capacitor foil of one of the second capacitor, the third capacitor, and the fourth capacitor, and the second electrode forms the first capacitor foil of the one of the second capacitor, the third capacitor, and the fourth capacitor.

14. The beam detector as claimed in claim 11, further comprising:

a third electrode, the third electrode and the second electrode forming one of the second capacitor, the third capacitor, and the fourth capacitor.

15. The beam detector as claimed in claim 14, wherein:
the circuit arrangement further comprises:
a fourth capacitor having a first capacitor foil connected to the first circuit node, the fourth capacitor being supplied with a fourth time-dependent voltage, the first time-dependent voltage and the fourth time-dependent voltage being clocked in phase,
the beam detector further comprises:
a fourth electrode; and
a fifth electrode, and
the fourth electrode and the second electrode and the fifth electrode and the second electrode form a remaining two other capacitors of the one of the second capacitor, the third capacitor, and the fourth capacitor.

16. The beam detector as claimed in claim 12, wherein the second electrode is arranged between the first electrode and the third electrode.

17. The beam detector as claimed in claim 11, wherein:
at least one of the first capacitor, the second capacitor, and the third capacitor of the circuit arrangement is formed by at least one of the first electrode and the second electrode; and
the remaining of the at least one of the first capacitor, the second capacitor, and the third capacitor are fixed-value capacitors.

18. The beam detector as claimed in claim 11, wherein the first electrode and the second electrode are metallic plates.

19. A circuit arrangement comprising:
a first capacitor, a second capacitor, and a third capacitor, each of the first capacitor, the second capacitor, and the third capacitor having a first capacitor foil connected to a first circuit node, the first capacitor being supplied with a first time-dependent voltage, the second capacitor being supplied with a second time-dependent voltage, the third capacitor being supplied with a third time-dependent voltage, the first time-dependent voltage and the second time-dependent voltage being clocked in antiphase, the second time-dependent voltage and the third time-dependent voltage being clocked in phase;
a fourth capacitor having a first capacitor foil connected to the first circuit node, the fourth capacitor being supplied with a fourth time-dependent voltage, the first time-dependent voltage and the fourth time-dependent voltage being clocked in phase;
an amplifier having inputs connected to the first circuit node and to a ground contact, the amplifier being configured to generate an output signal;
a comparator having two inputs, the comparator being configured to generate an output value; and
a synchronous demodulator configured to apply the output signal of the amplifier synchronously with a clock of the first time-dependent voltage alternately to the two inputs of the comparator,
wherein the circuit arrangement is configured to (i) generate a control value in dependence on the output value of the comparator and (ii) at least one of change amplitudes of the first time-dependent voltage and the third time-dependent voltage in dependence on the control value and change an amplitude of the second time-dependent voltage in dependence on the control value.

* * * * *